United States Patent [19]
Tanbakuchi

[11] Patent Number: 5,553,319
[45] Date of Patent: Sep. 3, 1996

[54] ROUTING YIG-TUNED MIXER

[75] Inventor: Hassan Tanbakuchi, Santa Rosa, Calif.

[73] Assignee: Hewlett-Packard Company, Palo Alto, Calif.

[21] Appl. No.: 378,884

[22] Filed: Jan. 23, 1995

Related U.S. Application Data

[63] Continuation of Ser. No. 94,833, Jul. 20, 1993, abandoned, which is a continuation-in-part of Ser. No. 924,698, Jul. 29, 1992, abandoned.

[51] Int. Cl.$^6$ .................................................. H04B 1/26
[52] U.S. Cl. ...................... 455/326; 455/319; 455/330; 333/202
[58] Field of Search .............................. 455/197.1, 323, 455/316, 317, 318, 325, 326, 333, 319, 330; 332/173; 333/202

[56] References Cited

U.S. PATENT DOCUMENTS 3,947,782  3/1976  Lohn ........................................ 455/326
4,817,200  3/1989  Tanbakuchi ............................... 455/323

*Primary Examiner*—Reinhard J. Eisenzopf
*Assistant Examiner*—Thanh Le

[57] ABSTRACT

A routing YIG-tuned resonator filter integrated with an image-enhanced, double-balanced mixer. The YIG-tuned resonator filter is preferably a four-sphere YIG-tuned preselector which is integrated with a low-loss, fundamentally or harmonically mixed, image-enhanced, double-balanced mixer to provide a high level of dynamic range in a harmonically mixed front end. An input resonator of the preselector in combination with a dual PIN diode switch switches low-frequency input signals (e.g., 0 to 2.9 GHz) to a low-band mixer. For RF input signals (e.g., 2.7 to 26.5 GHz), the four-sphere YIG-tuned preselector is combined with the image-enhanced, double-balanced mixer which incorporates a GaAs monolithic diode bridge integrated circuit. This provides a cost effective front end for a microwave spectrum analyzer.

23 Claims, 24 Drawing Sheets

ROUTING YIG-TUNED MIXER

CROSS-REFERENCE TO RELATED APPLICATIONS

This is a continuation of application Ser. No. 08/094,833 filed on Jul. 20, 1993, now abandoned, which is a continuation-in-part of U.S. patent application Ser. No. 07/924,698 entitled ROUTING YIG-TUNED MIXER filed on Jul. 29, 1992, abandoned in the name of Hassan Tanbakuchi and assigned to the same assignee as this patent application.

BACKGROUND OF THE INVENTION

This invention relates to electronic instruments for detecting and/or measuring electrical signals and, more particularly, to electronic instruments for detecting and/or measuring the frequency spectrum, e.g., DC through radio-frequency (RF), of electrical signals. Specifically, one embodiment of the invention provides a routing yttrium-iron-garnet (YIG) tuned mixer particularly adaptable for use in an electronic instrument known as a spectrum analyzer. Such a mixer, which can be an odd harmonic mixer or even harmonic mixer, but is preferably a switched odd or even harmonic mixer, can also be combined with at least one additional YIG-tuned resonator to form a routing YIG-tuned resonator filter and mixer.

Generally, a spectrum analyzer is a scanning receiver that displays power and modulation characteristics of electrical input signals over a selected frequency band. To cover a broad frequency range, e.g., from 0 to 26.5 GHz, an input signal is preferably divided into low-frequency and high-frequency portions. One aspect of the invention is concerned with effectively routing the input signal between the low- and high-frequency signal processing sections of the spectrum analyzer, depending upon the frequency of the input signal.

In this regard, FIG. 1 shows a block diagram illustrating the initial signal processing circuit, or "front end," of a conventional spectrum analyzer. Initially, all input signals, e.g., signals in the frequency range from 0 to 26.5 GHz, applied to an input 11 of the spectrum analyzer pass through a step attenuator 12 and are directed to a mechanical microwave relay switch 13 which selectively routes the input signals to the low-frequency signal processing section on line 14 or to the high-frequency signal processing section on line 15. Unfortunately, mechanical microwave relay switches are slow and wear out under heavy use.

On the one hand, low-frequency input signals, e.g., input signals having a frequency under 2.9 GHz, are applied to a low-frequency signal processing section of the spectrum analyzer. Input signals from 0 to 2.9 GHz are switched to a first converter 16 comprising a lowpass filter 17, a swept, YIG-tuned local oscillator (LO) 18, a mixer 19, and a bandpass filter 20 which up-convert the low-frequency input signals to a fixed intermediate frequency (IF) output signal that is applied to a low-frequency analysis circuit (not shown) of the spectrum analyzer.

On the other hand, high-frequency signals, e.g., RF (microwave) input signals having a frequency between 2.7 and 26.5 GHz, are passed through a tunable bandpass filter 21. The passed RF input signal is then down-converted by a harmonic mixer 22. The harmonic mixer 22 combines the RF input signal with a signal produced by a local oscillator (LO) 23, or a harmonic of the signal from the LO, to produce a predetermined IF output signal at a frequency suitable for further processing by the high-frequency analysis circuit (not shown) of the spectrum analyzer.

A spectrum analysis measurement is performed on a high-frequency RF input signal by sweeping the LO signal frequency over the frequency range of interest, while the predetermined IF frequency is monitored. The graph in FIG. 2 illustrates the result of the down conversion by the harmonic mixer 22 shown in FIG. 1, evidencing the relationship between the LO, RF, and predetermined IF frequencies. In FIG. 2, the vertical axis represents signal power, and the horizontal axis represents signal frequency. The predetermined IF signal 25 has a frequency equal to the difference between the LO signal (or harmonic) 27 and the RF input signal 29, so that the RF input signal is measured by monitoring a set IF frequency, below the LO signal frequency, at $f_{RF}=(n)f_{LO}-f_{IF}$. However, an image RF signal above the LO signal frequency, at $f'_{RF}=(n)f_{LO}+f_{IF}$, will also produce a signal at the monitored IF frequency. To resolve this ambiguity, the tunable bandpass filter 21 shown in FIG. 1 acts as a tunable bandpass filter over a frequency range including $f_{RF}$, as shown by the broken line curve 31 that appears in FIG. 2, thereby attenuating any image signal 33 at $f'_{RF}$. Therefore, the passband of the tunable bandpass filter 21 shown in FIG. 1 must track the sweeping LO signal, with the center frequency of the passband separated from the LO frequency (or harmonic) by the IF signal frequency.

The tunable bandpass filter 21 shown in FIG. 1 can be a YIG-tuned resonator filter, or preselector, which comprises a YIG sphere suspended between two orthogonal half loop conductors with the YIG sphere centered on the intersection of the loop axes. When the YIG sphere is not magnetized, an RF input signal is not transferred between the half loops, because there is no interaction between the RF input signal and the YIG sphere and the loops are perpendicular to each other. However, in the presence of an externally applied DC magnetic field along an axis perpendicular to the half loops, the dipoles in the YIG sphere align with the DC magnetic field, producing a strong net magnetization, M, in the YIG sphere. An RF input signal applied to the input half loop therefore produces an alternating RF magnetic field perpendicular to the externally applied DC magnetic field, which causes the dipoles in the YIG sphere to precess around the DC magnetic field at the frequency of the RF input signal. The precession frequency is equal to the frequency of the RF input signal if the RF input signal frequency equals or closely approximates the dipole resonance frequency of the spherical YIG resonator. The resonance frequency for a spherical YIG resonator is:

$$f_r = \gamma(H_0 \pm H_a),$$

where $H_0$ is the strength of the externally applied DC magnetic field in oersteds, $H_a$ is the internal anisotropy field (in oresteds) within the YIG material, and $\gamma$ is the gyromagnetic ratio (2.8 MHz/oersted).

If an RF input signal at or near $f_r$ is applied to the input half loop, the YIG material exhibits ferrimagnetic resonance, such that the precessing dipoles create a circularly polarized magnetic field, rotating at the RF input signal frequency, in a plane perpendicular to the externally applied DC magnetic field. This rotating magnetic field couples to the output half loop, including an RF signal in the output half loop that, at the resonance frequency $f_r$, is phase-shifted 90° from the RF input signal.

The YIG-tuned resonator filter therefore acts as a gyrator. The phase shift in one direction through the YIG-tuned resonator filter differs from the phase shift in the other direction by 180°. The filtering function is achieved because RF input signals deviating from the dipole resonance frequency by more than a small amount do not couple to the YIG sphere.

Because the resonance bandwidth can be made fairly narrow, the YIG resonator comprises a highly selective bandpass filter at RF frequencies, tunable by varying the strength of the externally applied DC magnetic field. Typical loaded Q values for YIG-tuned resonator filters range from 100 to 400.

However, the prior art circuit shown in FIG. 1 has several drawbacks. RF input signals in the frequency range from 2.7 to 26.5 GHz are switched to the broadband YIG-tuned resonator filter 21 which is used as a preselector. A filtered signal is applied to the harmonic mixer 22, where it is mixed with the fundamental or harmonics of the swept, YIG-tuned local oscillator (LO) 23 to produce the predetermined IF output signal. This approach has the shortcoming that microwave harmonic mixers are inefficient, which drastically reduces the sensitivity of the microwave spectrum analyzer, especially when mixing with higher harmonics that are at high frequency. Fundamental mixing has been used to overcome the sensitivity degradation problem. This is achieved by means of a broadband LO (i.e., 5 to 26.5 GHz) or by multiplying the frequency of the signal from a narrowband LO (i.e., 3 to 6.8 GHz) to produce a broadband LO source for the harmonic mixer 22. While these approaches offer performance advantages, they are expensive to implement.

Additionally, a schematic diagram of one known integrated harmonic mixer 22 is shown in FIG. 1A. This mixer comprises a single diode D having a first end connected to the YIG-tuned resonator output coupling loop. The other end of the diode D is connected to one end of a transmission line TL whose other end is connected to an LO signal coupler. A narrowband, e.g., 3 to 6.8 GHz, LO signal is coupled via the LO signal coupler to the transmission line TL. RF, LO, and IF signals are not isolated. The RF, LO, and IF currents all flow through the transmission line TL. Harmonic mixing is accomplished by biasing the diode D through a resistor R. The following drawbacks are apparent.

The LO signal, RF signal, image, and multiple mixing products all must flow through the transmission line TL and are terminated through an AC load. No image enhancement, in which higher order mixing products are reflected back to the mixer for further mixing, occurs. Also, the AC load must be a broadband load to maintain the response of the mixer flat across the frequency range of interest. Furthermore, harmonic mixing is accomplished by biasing the diode D. This class of mixer (single diode biased for different harmonics) is not efficient.

A schematic diagram of another known harmonic mixer 22 is shown in FIG. 1B. This mixer is a single-balanced fundamental and odd order harmonic mixer, as described in U.S. Pat. No. 4,817,200. The LO and RF signals are isolated through the balun action of a full output coupling loop. This mixer is an odd harmonic mixer in which the IF signal at a frequency $f_{IF}=(2n+1)f_{LO}\pm f_{RF}$ flows through port 1 and port 2. The LO and RF signals are isolated, eliminating a need for broadband microwave load needed in the case of single diode mixing in the mixer shown in FIG. 1A.

However, the IF signal must be diplexed from the LO signal by means of an inductor L and a capacitor C through port 1 and port 2. The inductor L is the return path for the IF signal at a frequency $f_{IF}=(2n+1)f_{LO}-f_{RF}$, but mixing products at a frequency $f_{IF}=(2n+1)f_{LO}+f_{RF}$ flow through port 1 to the LO input. Therefore, mixing products at frequencies $(2n+1)f_{LO}+f_{RF}$ (i.e., the image frequency) are transmitted through port 1 and must be terminated by the LO source impedance. No enhancement of images and multiples is achieved.

SUMMARY OF THE INVENTION

One embodiment of the invention provides a broadband routing YIG-tuned resonator filter and mixer in which low-frequency signals are preferably routed to a low-frequency output and high-frequency signals are routed to four YIG-tuned resonators combined to provide a tunable bandpass filter and image-enhanced, double-balanced mixer. An electromagnet produces a DC magnetic field that is uniform over the four YIG resonators to tune the resonance frequency of the resonators. The first YIG resonator acts as a first stage of the filter and, in combination with a routing circuit comprising two PIN diodes, routes the input signal either to the low-frequency output or to succeeding stages of the filter and mixer. The second YIG resonator acts as a second stage of the filter. The third YIG resonator acts as a third stage of the filter. The fourth YIG resonator acts as a fourth stage of the filter, as well as an image-enhanced, double-balanced mixer capable of odd or even, and preferably switched odd or even harmonic mixing, without the need for mixer biasing. The mixer combines the RF input signal with a fundamental or harmonic of a swept local oscillator (LO) signal to produce an IF output signal at an IF output.

BRIEF DESCRIPTION OF THE DRAWINGS

The above and other objects and features and the concomitant advantages of the present invention will be better understood and appreciated by those skilled in the art in view of the description of the preferred embodiments given below in conjunction with the accompanying drawings. In the drawings:

FIG. 9, comprising

FIG. 11, comprising

FIG. 13, comprising

FIG. 15, comprising

DETAILED DESCRIPTION OF THE PREFERRED EMBODIMENTS

Figure 1:
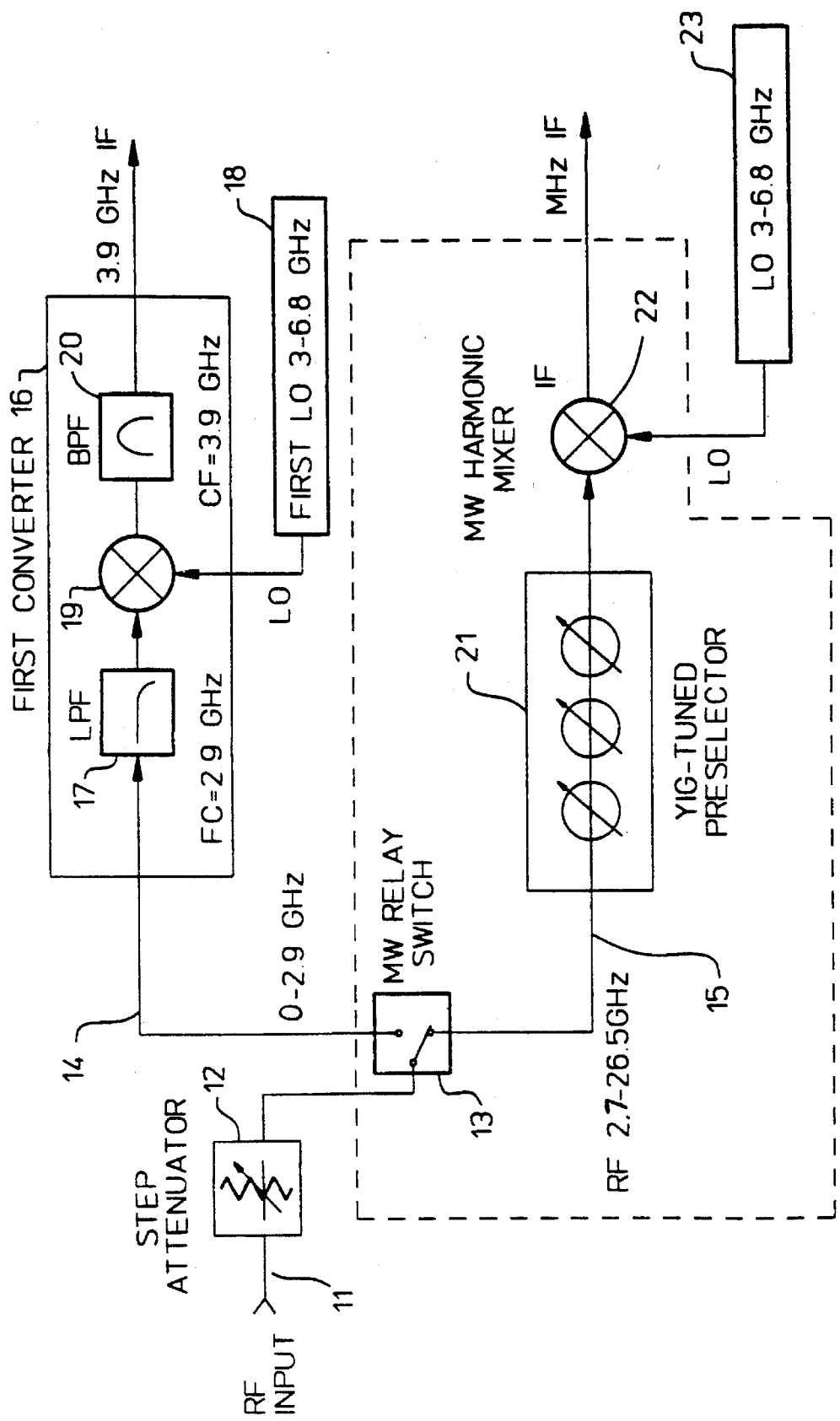
FIG. 1 is a block diagram of a prior art circuit in a spectrum analyzer.
Figure 1A:
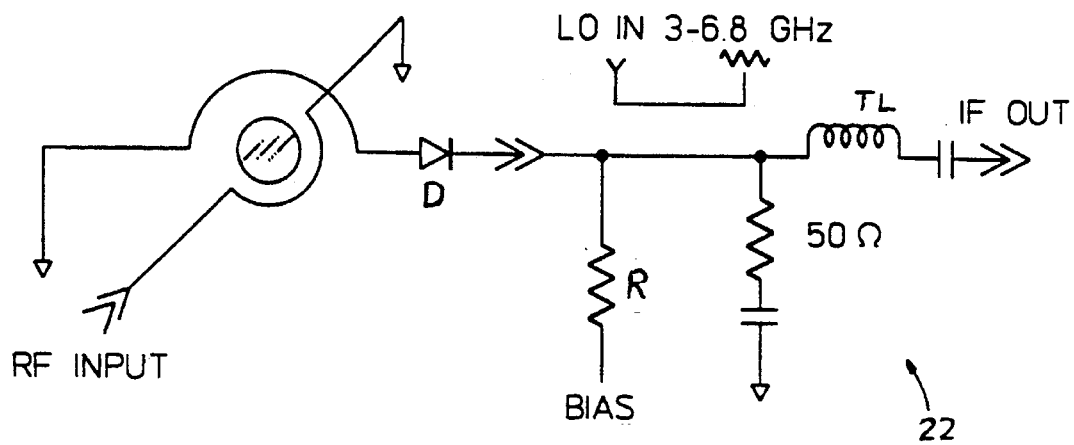
FIG. 1A is a schematic diagram of a prior art mixer circuit used in the circuit shown in FIG. 1.
Figure 1B:
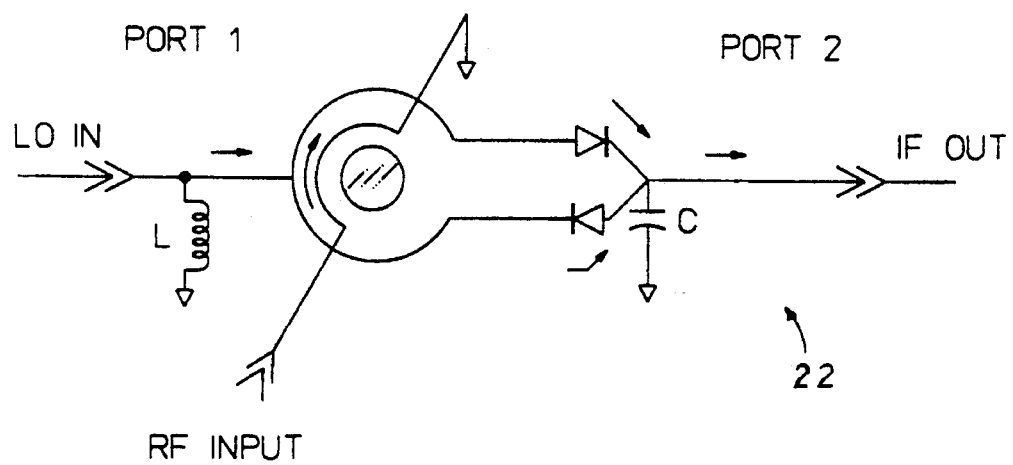
FIG. 1B is a schematic diagram of an alternate prior art mixer circuit used in the circuit shown in FIG. 1.
Figure 2:
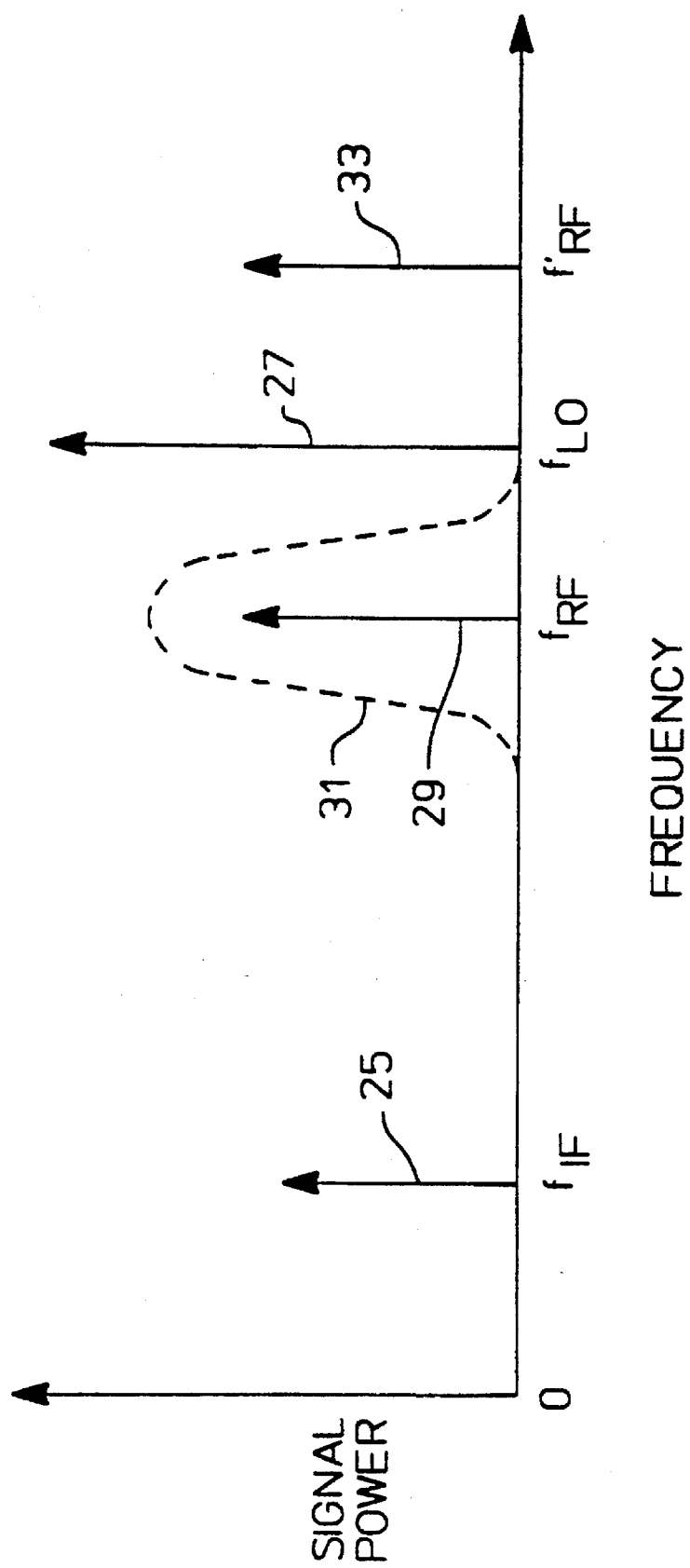
FIG. 2 is a graph which illustrates the relationship of RF, LO, and IF signals in the prior art circuit shown in FIG. 1.
Figure 3:
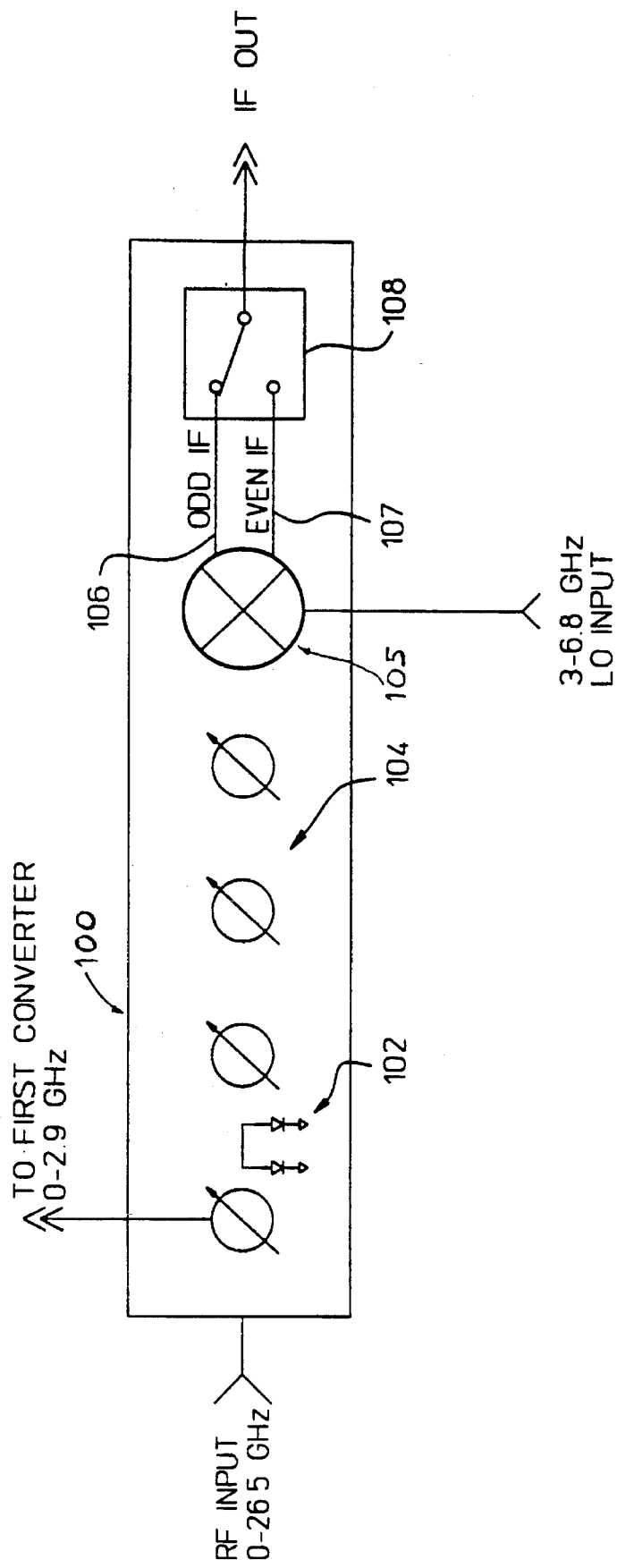
FIG. 3 is a block diagram of one embodiment of a routing YIG-tuned resonator filter and image-enhanced, double-balanced mixer circuit constructed in accordance with the present invention.

A block diagram of a preferred embodiment of a routing YIG-tuned resonator filter and mixer circuit in accordance with the invention, generally indicated by the numeral 100, is shown in FIG. 3. Routing YIG-tuned resonator filter and mixer circuit 100 comprises an electronically switched, YIG-tuned resonator filter integrated with a double-balanced, image-enhanced YIG-tuned mixer to overcome speed and reliability problems of mechanical switching and to increase the sensitivity of a spectrum analyzer. Routing YIG-tuned resonator filter and mixer circuit 100 incorporates a diode bridge mixer circuit topology and preferably employs a high level of integration. Routing YIG-tuned resonator filter and mixer circuit 100 can be incorporated into a high-performance portable spectrum analyzer, for example.

As shown in FIG. 3, routing YIG-tuned resonator filter and mixer circuit 100 comprises a routing circuit 102 and a four-sphere, YIG-tuned preselector 104 in which the input sphere combined with two PIN diode microwave integrated circuits (MICs) replace a conventional mechanical microwave relay switch. Preselector 104 functions as a highly selective tunable bandpass filter to attenuate unwanted mixing products, such as image and multiple responses. In conjunction with the fourth YIG sphere, a GaAs monolithic Schottky diode integrated circuit functions as a highly efficient image-enhanced, double-balanced YIG-tuned mixer 105 preferably having isolated odd and even IF ports 106 and 107, respectively. To achieve the desired mixing product, preselector 104 is tuned to the RF input signal frequency, the correct local oscillator (LO) signal is applied to mixer 105, and depending upon the desired mixing harmonic number, an IF switch 108 is switched to even or odd IF port 106 or 107 of mixer 105 to extract the predetermined IF signal output.

Figure 4:
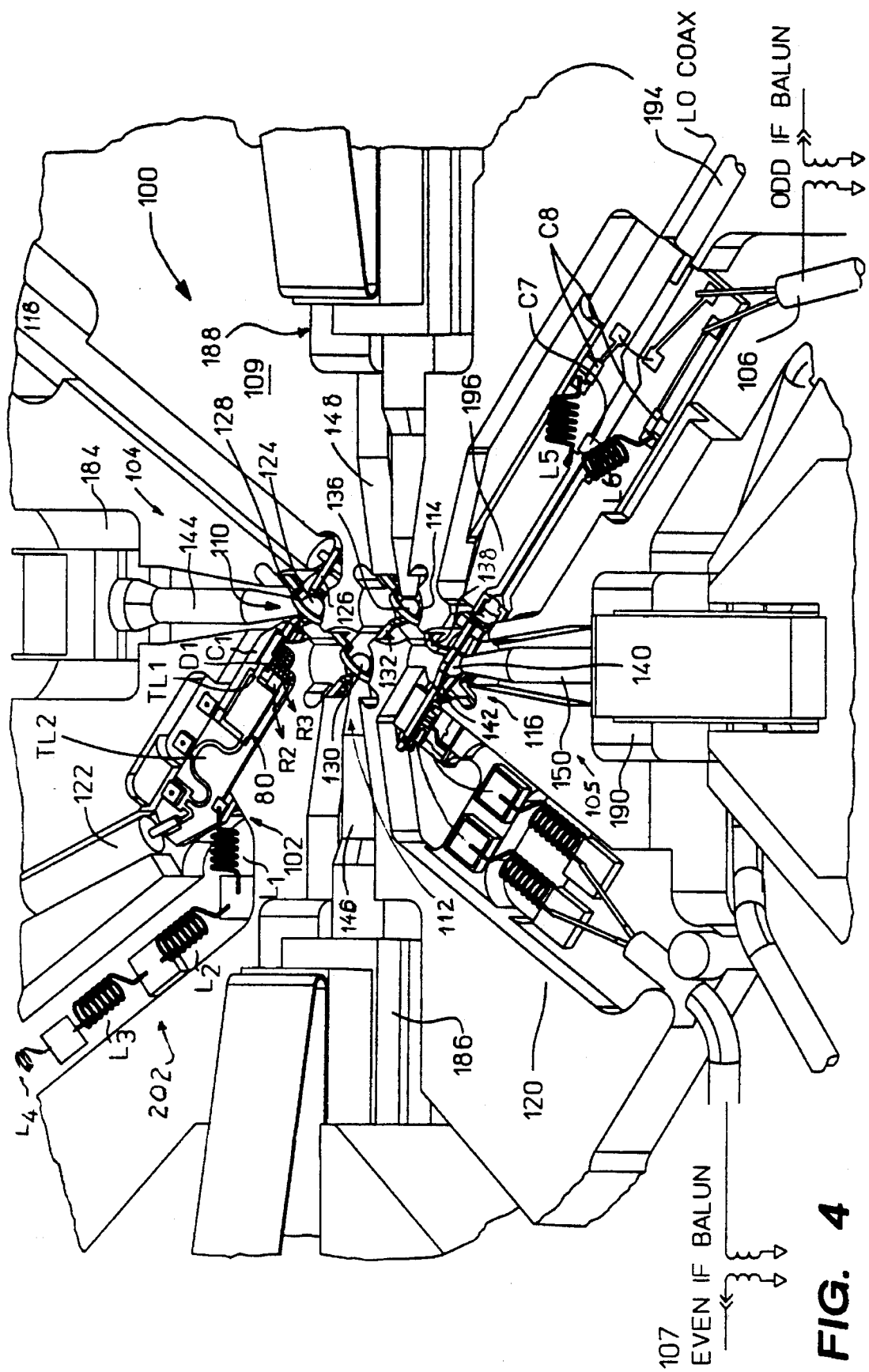
FIG. 4 is a perspective view of the routing YIG-tuned resonator filter and image-enhanced, double-balanced mixer circuit shown in FIG. 3.

As shown in FIG. 4, routing YIG-tuned resonator filter and mixer circuit 100 is mounted in a conductive chassis 109, typically constructed of metalized plastic or metalized high resistance metal. Routing YIG-tuned resonator filter and mixer circuit 100 preferably includes an input resonator 110, a first intermediate resonator 112, a second intermediate resonator 114, and an output resonator 116. Chassis 109 is provided with openings for mounting resonators 110, 112, 114, and 116, as well as associated circuitry.

The resonators 110, 112, 114, and 116 are connected in series between an input 118, to which input signals are applied, and an IF output 120 preferably comprising odd and even IF ports 106 and 107. Preferably, input 118 is also connected to a low-frequency output 122, as will be described later. Input 118, IF output 120, and low-frequency output 122 can be in the form of coaxial connections, as shown in FIG. 4.

Input resonator 110 includes a YIG sphere 124 mounted between an input coupling loop 126 and a coupling loop 128. Resonator 112 includes a YIG sphere 130 mounted between coupling loop 128 and a coupling loop 132. Resonator 114 includes a YIG sphere 136 mounted between coupling loop 132 and a coupling loop 138. Output resonator 116 includes a YIG sphere 140 mounted between coupling loop 138 and an output coupling loop 142. YIG spheres 124, 130, 136, and 140 are supported by support rods 144, 146, 148, and 150, respectively, which are electrically insulating and non-magnetic.

Each of the coupling loops 126, 128, 132, 138, and 142 is conductive. Input coupling loop 126 comprises a half loop, a first end of which is connected to input 118. Coupling loops 128, 132, and 138 each comprise a double half loop for interconnecting successive resonators. Output coupling loop 142 comprises a full loop structure operationally equivalent to a half loop connected to IF output 120. The input and output coupling loops of each resonator are preferably orthogonal, but can deviate from orthogonal by up to about 10° without significant degradation in performance. As shown in FIG. 4, coupling loops 126, 128, 132, 138, and 142 are configured in a zigzag pattern to enable the desired spacing between adjacent resonators 110, 112, 114, and 116.

As shown in FIG. 4, while the first end of input coupling loop 126 is connected to input 118, a second end of coupling loop 126 is preferably connected to routing circuit 102. On the one hand, routing circuit 102 couples input signals in the frequency range from 0 to approximately 2.9 GHz, for example, to low-frequency output 122 to which a conventional low-frequency signal processing section (not shown) can be connected. On the other hand, routing circuit 102 causes RF input signals greater than approximately 2.7 GHz to be coupled from input coupling loop 126 by YIG sphere 124 to coupling loop 128. Routing circuit 102 will be described in more detail later. In an alternate embodiment in which only high-frequency signals are to be processed, routing circuit 102 would be eliminated, and the second end of input coupling loop 126 would be connected to ground (common).

Figure 5:
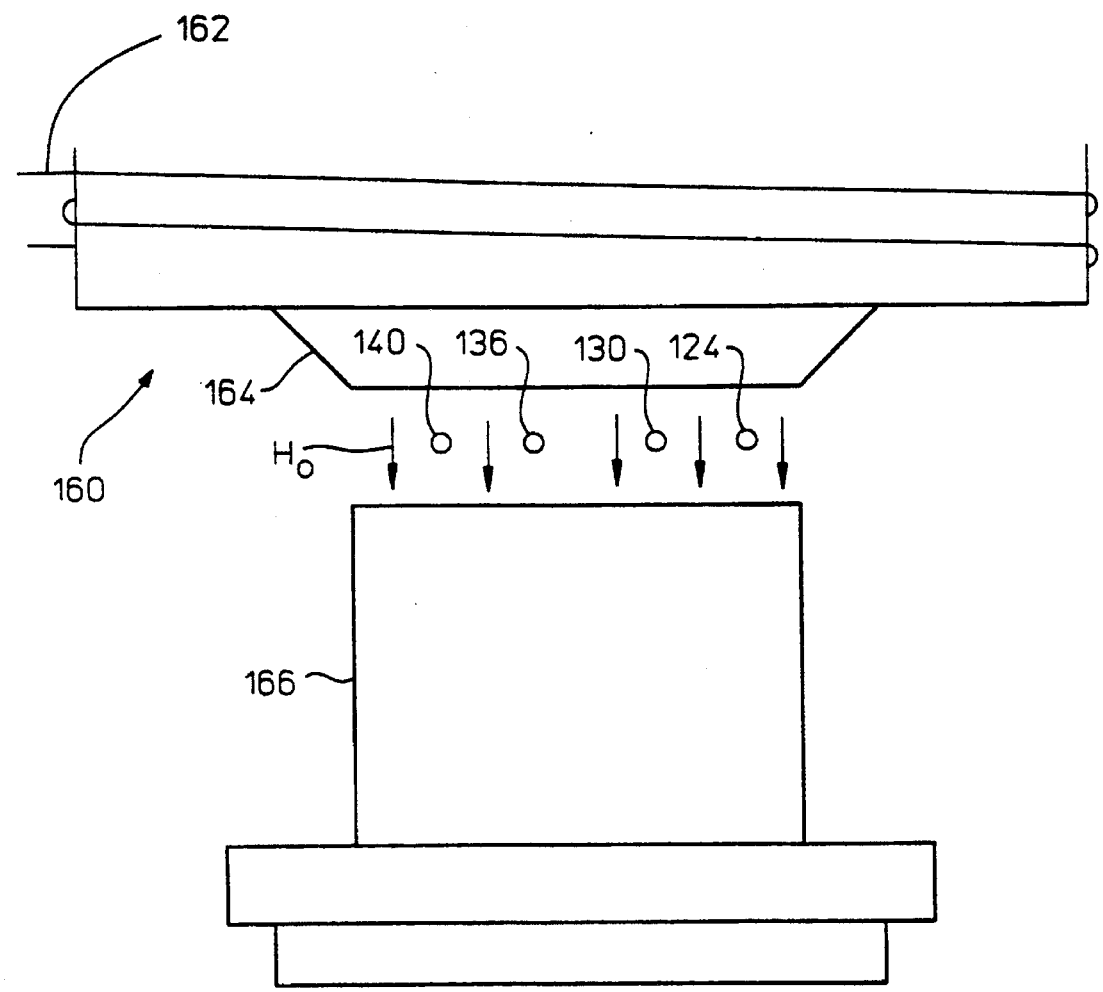
FIG. 5 is a simplified elevational view of the routing YIG-tuned resonator filter and image-enhanced, double-balanced mixer circuit shown in FIG. 4.

As shown in FIG. 5, an external DC magnetic field $H_0$ is applied to resonators 110, 112, 114, and 116 (represented in FIG. 5 by YIG spheres 124, 130, 136, and 140, respectively). DC magnetic field $H_0$ is generated by an electromagnet 160 having a coil 162. Resonators 110, 112, 114, and 116 are positioned in a gap between a fixed polepiece 164 and a rotatable polepiece 166. The rotatable polepiece is described in detail in copending patent application U.S. Ser. No. 07/921,877 entitled YIG-TUNED CIRCUIT WITH ROTATABLE MAGNETIC POLEPIECE filed on Jul. 29, 1992, in the name of Hassan Tanbakuchi, the disclosure of which is hereby incorporated in its entirety by this reference. The resonators 110, 112, 114, and 116 are typically located in a plane perpendicular to the direction of DC magnetic field $H_0$. By varying the magnitude of DC magnetic field $H_0$ through controlling the current flowing in coil 162 of electromagnet 160, the resonance frequency of resonators 110, 112, 114, and 116 is tuned over a desired frequency range. Specifically, as DC magnetic field $H_0$ is increased, the resonance frequency is increased.

Referring again to FIG. 4, YIG sphere support rods 144, 146, 148, and 150 are mounted to sphere positioning assemblies 184, 186, 188, and 190, respectively. Sphere positioning assemblies 184, 186, 188, and 190 enable adjustment of the respective positions of YIG spheres 124, 130, 136, and 140 in three Cartesian directions (i.e., along X-, Y-, and Z-axes) and rotation of the respective YIG spheres. Sphere positioning assemblies 184, 186, 188, and 190 assure that each YIG sphere is optimally positioned with respect to the associated input and output coupling loops. In addition, sphere positioning assemblies 184, 186, 188, and 190 allow YIG spheres 124, 130, 136, and 140 to be rotated so that the crystalline axis of each YIG sphere has a desired orientation with respect to DC magnetic field $H_0$. Sphere positioning assemblies 184, 186, 188, and 190 are described in detail in copending patent application U.S. Ser. No. 07/921,823 entitled YIG SPHERE POSITIONING APPARATUS filed on Jul. 29, 1992, in the names of Thomas W. Finkle and Terry A. Jones, the disclosure of which is hereby incorporated in its entirety by this reference.

In an exemplary implementation of routing YIG-tuned resonator filter and mixer circuit 100 shown in FIG. 4, YIG spheres 124, 130, 136, and 140 have diameters of about 0.3 mm, and the radius of each of the coupling loops 126, 128, 132, 138, and 142 is about 0.4 mm. YIG sphere support rods 144, 146, 148, and 150 are preferably aluminum oxide. The ends of coupling loops 128, 132, and 138 are connected to ground. In operation, an input signal received on input 118 causes a current to flow through input coupling loop 126. In the preferred embodiment which incorporates routing circuit 102, any input signal having a frequency from 0 to 2.9 GHz, for example, flows from input coupling loop 126 through routing circuit 102 to low-frequency output 122. Any input signal having a frequency from 2.7 to 26.5 GHz, for example, results in an RF current in input coupling loop 126 which produces an RF magnetic field in the vicinity of YIG sphere 124. In the absence of YIG sphere 124, the RF magnetic field is not coupled to orthogonal coupling loop 128. However, when externally applied DC magnetic field $H_0$ causes YIG sphere 124 to have a resonance frequency that is the same or nearly the same as the frequency of the RF input signal, the RF signal causes the dipoles in YIG sphere 124 to precess at the frequency of the RF signal. The precessing dipoles create a circularly polarized RF magnetic field which is coupled to coupling loop 128. Thus, resonator 110 passes RF signals having the same or nearly the same frequency as the resonance frequency of YIG sphere 124. Resonators 112, 114, and 116 operate in the same manner to provide a highly selective tuneable RF bandpass filter. By varying DC magnetic field $H_0$ responsive to varying the current through coil 162 of electromagnet 160, the passband of the tunable bandpass filter comprised of resonators 110, 112, 114, and 116 is tuned over a broad frequency range. In the embodiment of routing YIG-tuned resonator filter and mixer circuit 100 shown in FIG. 4, output resonator 116 also comprises image-enhanced, double-balanced YIG-tuned mixer 105. An LO signal is applied to mixer 105 through an LO input 194 and a microstrip circuit 196. LO input 194 can be in the form of a coaxial connection, as shown in FIG. 4. Preferably, the IF output signal of mixer 105 is divided, depending on whether an odd or even harmonic mixing product is produced, and appears on IF output 120 comprising odd IF port 106 and even IF port 107. Mixer 105 will be described in more detail later. Initially, however, routing circuit 102 will now be described.

Figure 6:
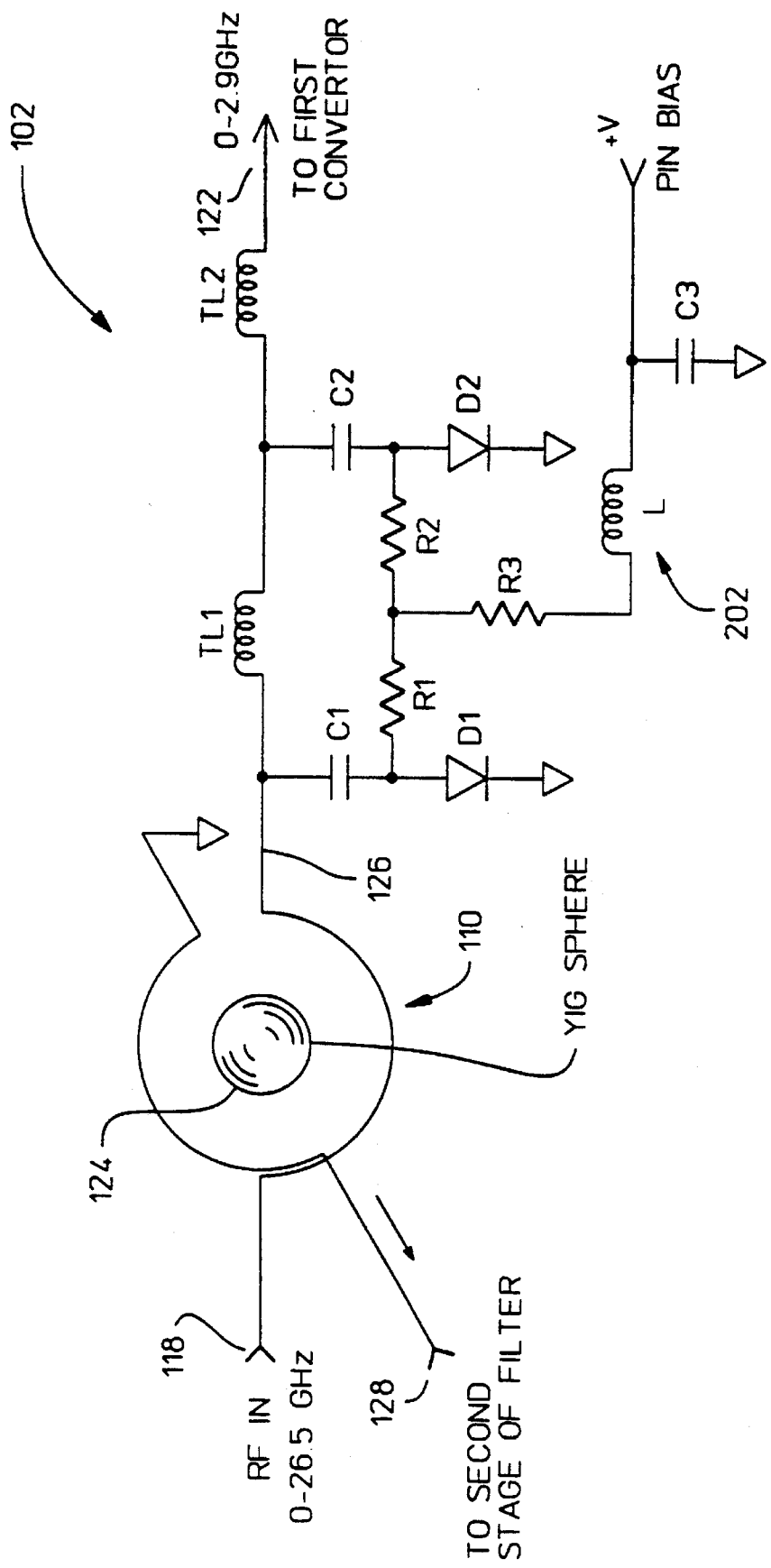
FIG. 6 is a schematic diagram of an embodiment of a routing circuit preferably incorporated into the routing YIG-tuned resonator filter and image-enhanced, double-balanced mixer circuit shown in FIG. 4.

Preferably, a mechanical microwave relay switch is eliminated by integrating routing circuit 102 comprising dual shunt PIN diodes with the first stage of the YIG-tuned resonator filter of routing YIG-tuned resonator filter and mixer circuit 100, as shown in FIG. 3. In one aspect of the invention, routing circuit 102 has the following circuit configuration and provides the desired alternate low-frequency band and high-frequency band switching operation, as follows. As shown in FIG. 6, input signals applied to input 118 propagate through input coupling loop 126. Input coupling loop 126 in conjunction with routing circuit 102 and an associated bias network 202 provide a low-loss electronic switch to route low-frequency input signals to low-frequency output 122 and to couple high-frequency input signals through input resonator 110 to coupling loop 128 to be down-converted, as will be described in more detail later.

On the one hand, input signals in the frequency range from 0 to 2.9 GHz, for example, are routed to low-frequency output 122 with a maximum loss of 1 dB. On the other hand, RF input signals in the frequency range from 2.7 to 26.5 GHz are coupled to the input resonator 110 by the input coupling loop 126.

As shown in FIGS. 4 and 6, routing circuit 102 comprises a first transmission line $TL_1$ and a second transmission line $TL_2$ connected in series between the second end of input coupling loop 126 and low-frequency output 122. Routing circuit 102 also comprises a capacitor $C_1$ and a diode $D_1$ connected in series between the junction of the second end of input coupling loop 126 and first transmission line $TL_1$, on the one hand, and ground, on the other hand. Routing circuit 102 further comprises a capacitor $C_2$ and a diode $D_2$ connected in series between the junction of first and second transmission lines $TL_1$ and $TL_2$, on the one hand, and ground, on the other hand. Diodes $D_1$ and $D_2$ are preferably PIN diodes. Additionally, routing circuit 102 comprises bias network 202. Bias network 202 comprises a resistor $R_1$ having a first end connected to the junction of capacitor $C_1$ and diode $D_1$ and a resistor $R_2$ having a first end connected to the junction of capacitor $C_2$ and diode $D_2$, each of resistors $R_1$ and $R_2$ having a second end connected to a first end of a resistor $R_3$. A second end of resistor $R_3$ is connected to a first end of an inductor L, which preferably comprises a series of coils $L_1$, $L_2$, $L_3$, and $L_4$, as shown in FIG. 4. A capacitor $C_3$ is connected between a second end of inductor L and ground. A bias voltage V+ is selectively connected to the second end of inductor L to simultaneously bias diodes $D_1$ and $D_2$ "on." Otherwise, diodes $D_1$ and $D_2$ are "off."

In operation, low-band input signals from 0 to 2.9 GHz are directed to low-frequency output 122 and hence to a low-frequency signal processing section (not shown) by biasing "off" diodes $D_1$ and $D_2$. The combination of the inductances of input coupling loop 126 and transmission lines $TL_1$ and $TL_2$ and "off" capacitances of diodes $D_1$ and $D_2$ creates a low-pass filter, which only slightly affects (i.e., insertion loss≦1 dB) input signals below 2.9 GHz, for example, that pass to low-frequency output 122.

For RF input signals from 2.7 to 26.5 GHz, diodes $D_1$ and $D_2$ are forward-biased (turned "on") by applying bias voltage V+, presenting a low impedance at the second end of input coupling loop 126. This assures efficient coupling of RF input signals to YIG sphere 124.

Considered in more detail, routing circuit 102 operates as follows. Input signals in the frequency range from 0 to 2.9 GHz applied to input 118 flow through input coupling loop 126. With diodes $D_1$ and $D_2$ reversed-biased (turned "off"), the "off" capacitance of diodes $D_1$ and $D_2$ in combination with the inductances of input coupling loop 126 and first and second transmission lines $TL_1$ and $TL_2$ provide a low-loss lowpass filter preferably having a 6 GHz cutoff frequency. Bias network 202 is configured such that as the frequency of input signals increases above approximately 100 MHz, for example, and the impedance of capacitors $C_1$ and $C_2$ therefore decreases, resistors $R_1$, $R_2$, and $R_3$ appear as a load at the junction between the second end of input coupling loop 126 and transmission line $TL_1$. Additionally, inductor L, comprising coils $L_1$, $L_2$, $L_3$, and $L_4$, and capacitor $C_3$ increase the effective impedance presented by resistors $R_1$, $R_2$, and $R_3$ to capacitors $C_1$ and $C_2$ as the frequency of input signals increases.

For RF input signals in the frequency range from 2.7 to 26.5 GHz, diodes $D_1$ and $D_2$ are forward-biased (turned "on"). Consequently, diode $D_1$ produces a very low impedance at the second end of input coupling loop 126, causing the RF input signals to couple through YIG sphere 124 to coupling loop 128. Since low-frequency output 122 is connected to an unknown impedance in parallel with the series combination of diode $D_1$ and capacitor $C_1$ and associated interconnect inductance, at some frequencies in the frequency band from 2.7 to 26.5 GHz a parallel resonance could occur if capacitor $C_2$ and diode $D_2$ were not present. However, in the presence of diode $D_2$ being forward-biased (turned "on") and capacitor $C_2$, the unknown impedance connected to low-frequency output 122 is loaded by the series combination of capacitor $C_2$ and the low "off" resistance of diode $D_2$, avoiding any potential parallel resonance of capacitor $C_1$ and diode $D_1$ with an unknown impedance connected to low-frequency output 122.

Referring again to FIG. 4, in routing YIG-tuned resonator filter and mixer circuit 100, a four-stage, YIG-tuned bandpass filter or preselector 104 comprising resonators 110, 112, 114, and 116 is used to achieve a high degree of selectivity (≧90 dB rejection of image and multiple mixing products). RF input signals in the frequency range from 2.7 to 26.5 GHz are filtered by the first, second, and third stages of preselector 104 and then applied to the fourth stage. The fourth stage comprising resonator 116 operates both as the fourth filter stage and as an element of image-enhanced, double-balanced YIG-tuned mixer 105 to down-convert the RF input signals to the predetermined IF output signal.

Figure 7:
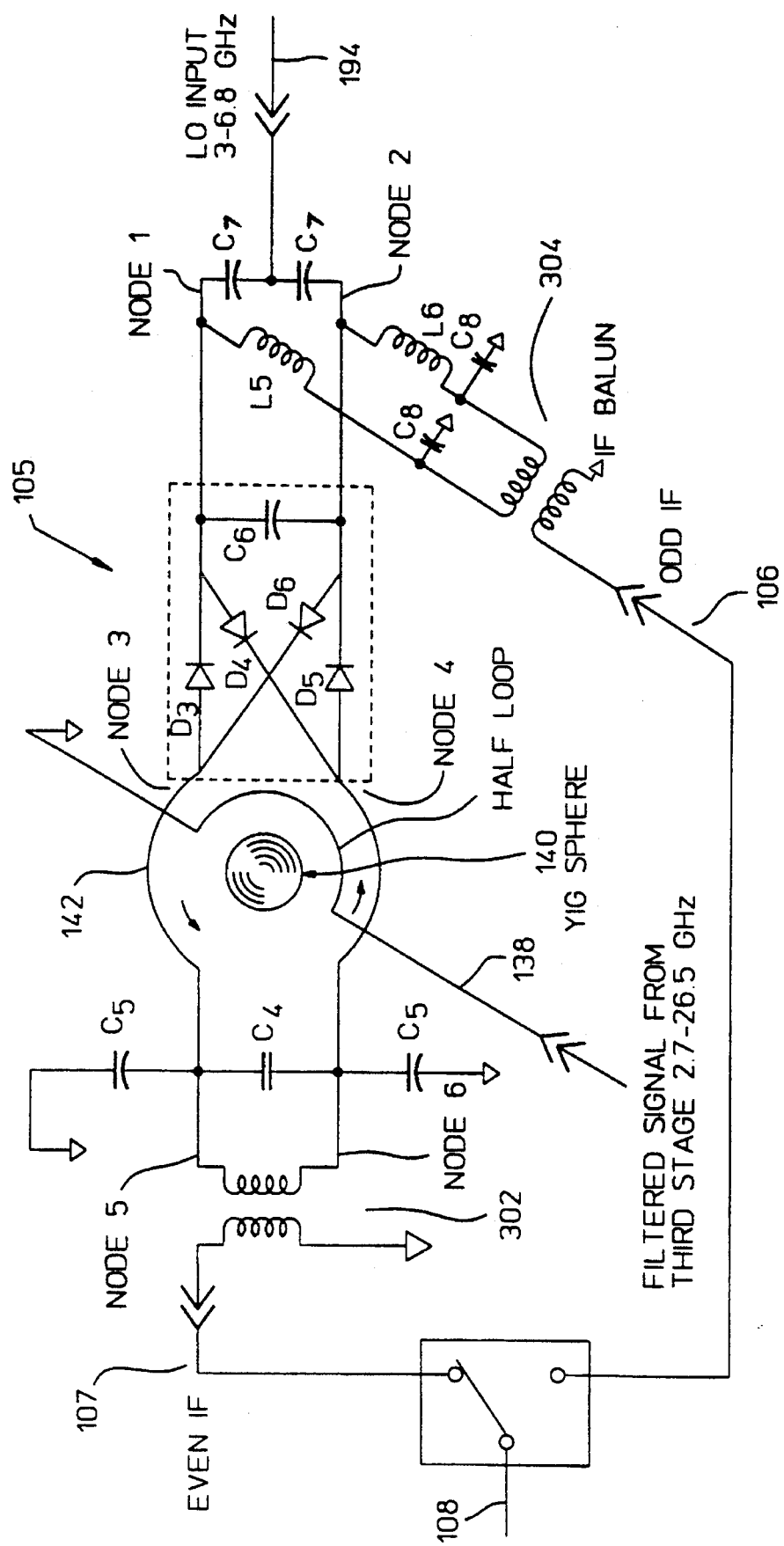
FIG. 7 is a schematic diagram of an embodiment of the image-enhanced, double-balanced YIG-tuned mixer incorporated into the routing YIG-tuned resonator filter and image-enhanced, double-balanced mixer circuit shown in FIG. 4, which mixes both odd and even harmonic products of a local oscillator signal with an RF input signal to produce a switched predetermined IF signal output.
Figure 8:
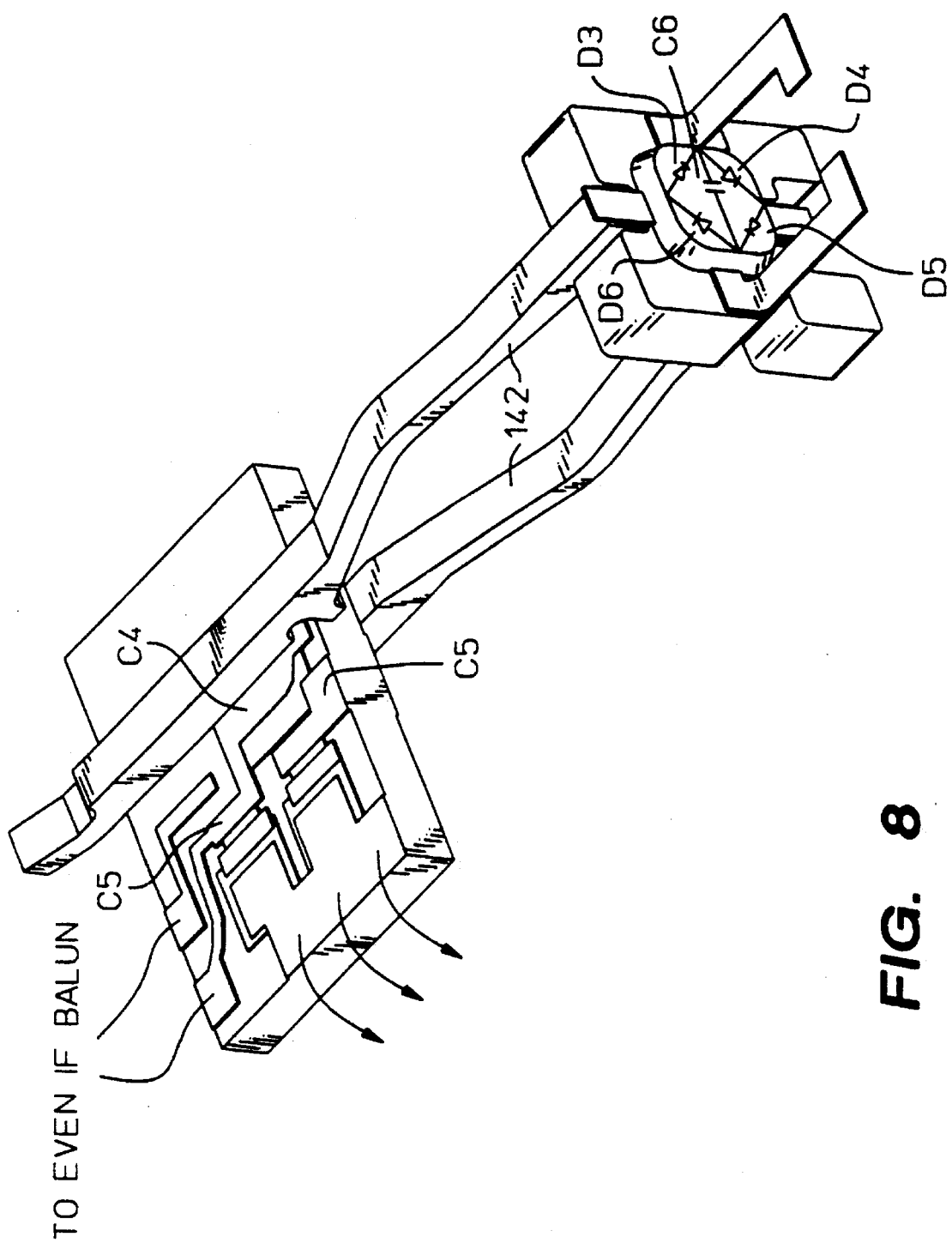
FIG. 8 is a detailed perspective view of the image-enhanced, double-balanced YIG-tuned mixer incorporated into the routing YIG-tuned resonator filter and image-enhanced, double-balanced mixer circuit shown in FIG. 4.

FIG. 7 shows a schematic diagram of the fourth stage of preselector 104, as well as image-enhanced, double-balanced YIG-tuned mixer 105. As shown in FIGS. 4, 7, and 8, mixer 105 comprises the second half loop of coupling loop 138 and full output coupling loop 142. Output coupling loop 142 is terminated at a first end by a capacitor $C_4$ and terminated at a second end by a monolithic GaAs diode integrated circuit comprising a diode bridge including diodes $D_3$, $D_4$, $D_5$, and $D_6$. Diodes $D_3$, $D_4$, $D_5$, and $D_6$ are preferably Schottky diodes. No biasing of diodes $D_3$, $D_4$, $D_5$, and $D_6$ is needed. Mixer 105 also comprises capacitors $C_5$ connected between the respective ends of capacitor $C_4$ and ground. Mixer 105 further comprises a first IF balun 302 having an input connected in parallel with capacitor $C_4$ at the first end of output coupling loop 142. IF balun 302 functions as an even harmonic IF balun. An output of IF balun 302 is connected to even IF port 107.

As shown in FIGS. 4 and 7, image-enhanced, double-balanced YIG-tuned mixer 105 additionally comprises a capacitor $C_6$ connected across diode bridge $D_3$, $D_4$, $D_5$, and $D_6$. Mixer 105 further comprises capacitors $C_7$ connected in series across capacitor $C_6$. The junction between capacitors $C_7$ is connected to LO input 194.

Image-enhanced, double-balanced YIG-tuned mixer 105 also comprises inductors $L_5$ and $L_6$ having first ends connected to the respective junctions of capacitor $C_6$, on the one hand, and capacitors $C_7$, on the other hand. Mixer 105 further comprises a second IF balun 304 having an input connected across the second ends of inductors $L_5$ and $L_6$. IF balun 304 functions as a fundamental and odd harmonic IF balun. An output of IF balun 304 is connected to odd IF port 106. Finally, mixer 105 comprises capacitors $C_8$ connected between the respective junctions of inductor $L_5$ and IF balun 304 and inductor $L_6$ and IF balun 304, on the one hand, and ground, on the other hand.

YIG sphere 140 transforms the RF input signal flowing through coupling loop 138 into a balanced, circular current flowing in output coupling loop 142 via capacitor $C_4$. The combination of output coupling loop 142 and capacitor $C_4$ effectively acts as a tunable microwave balun. The circulating RF input signal mixes with the LO signal applied to LO input 194, or appropriate harmonics of the LO signal, thus producing an odd or even harmonic mixing product at odd or even IF port 106 or 107, respectively.

To achieve image- and multiple-mixing-product enhancement, capacitors $C_4$ and $C_6$ are incorporated, reflecting high-frequency mixing products (i.e., ≧3 GHz) back to mixer 105 to remix, which results in a highly efficient mixer. The only mixing product that flows to odd or even IF port 106 or 107 is the predetermined IF signal (e.g., $f_{IF}$=310.7 MHz). As shown in FIG. 7, selecting the desired harmonic mixing product is achieved by tuning preselector 104 to an RF input signal, applying the correct LO signal to mixer 105, and switching IF switch 108 to odd or even IF port 106 or 107.

The LO and odd harmonic IF signals are diplexed through capacitors $C_7$ and $C_8$ and inductors $L_5$ and $L_6$. Nodes 1, 2, 5, and 6 are virtual ground ports for the RF input signal. Nodes 5 and 6 are AC ground nodes for the LO signal to provide an LO return path through capacitors $C_5$. Odd harmonic mixing products flow into node 1 and out of node 2. Node 3 and node 4 are virtual ground ports for odd harmonic mixing products (i.e., $f_{IF}=(2n+1)f_{LO}\pm f_{RF}$). Capacitor $C_6$ provides a short circuit for odd IF products at high frequency. The high-frequency short circuit reflects high-frequency odd harmonic mixing products back to mixer 105 for remixing. This remixing increases the efficiency of mixer 105 at the predetermined IF (i.e., image and multiple enhancement). At the same time, the predetermined IF signal is allowed to flow to IF balun 304. Even mixing products flow out of node 6 into node 5. Also, nodes 1 and 2 are virtual ground ports to even harmonic mixing products (i.e., $f_{IF}=2nf_{LO}\pm f_{RF}$). Capacitor $C_4$ provides a short circuit to even harmonic IF products at high frequency. The high-frequency short circuit reflects high-frequency even harmonic mixing products back to mixer 105 for remixing. This remixing increases the efficiency of mixer 105 at the predetermined IF (i.e., image and multiple enhancement), allowing only the predetermined IF to flow to IF balun 302. Odd and even IF ports 106 and 107 are isolated. Therefore, odd IF port 106 does not load even IF port 107, and visa versa.

Figure 9A:
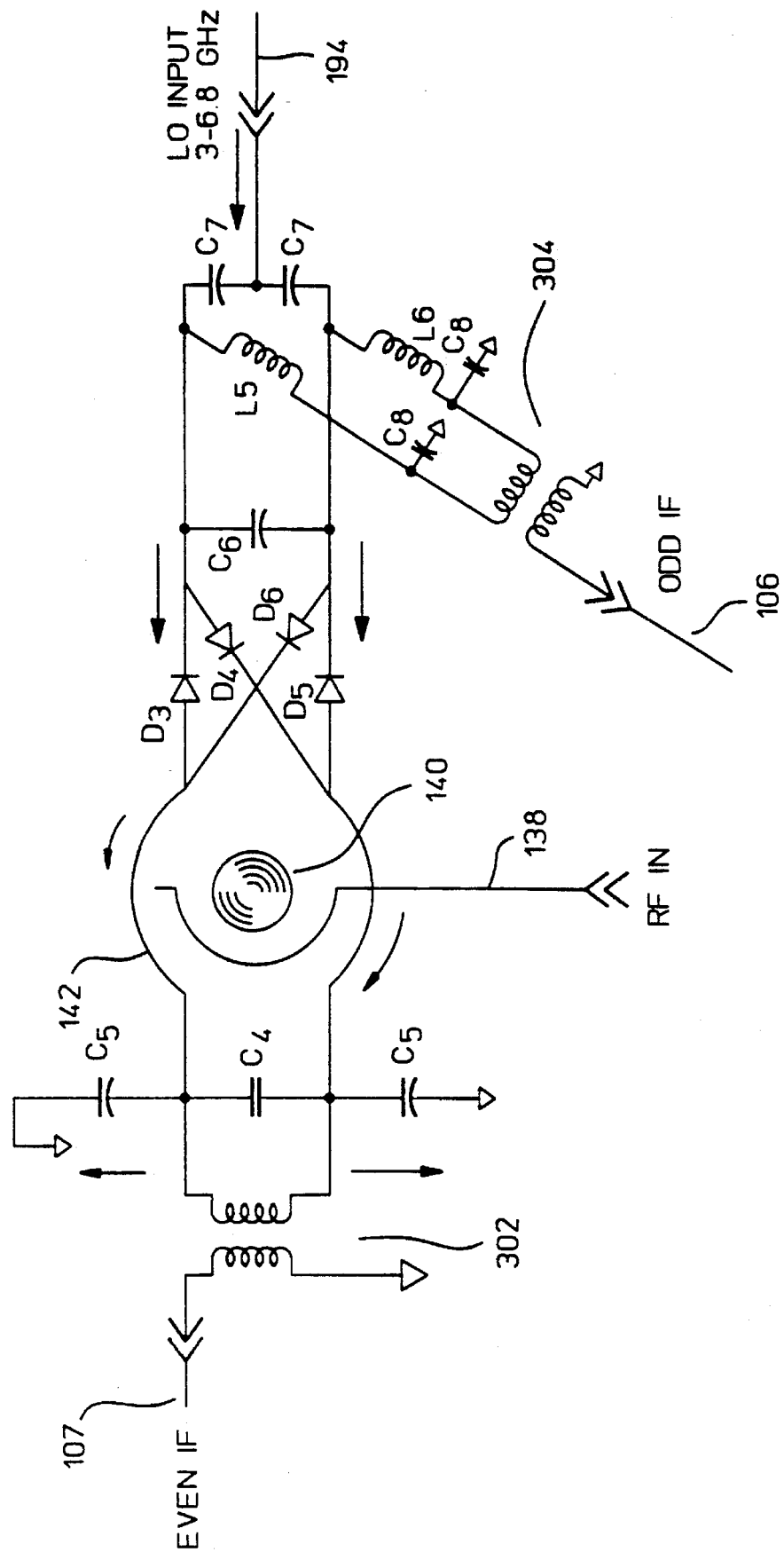
FIGS. 9A, 9B, and 9C, is a schematic diagram to facilitate an understanding of operation of the image-enhanced, double-balanced YIG-tuned mixer shown in FIG. 7.
Figure 9B:
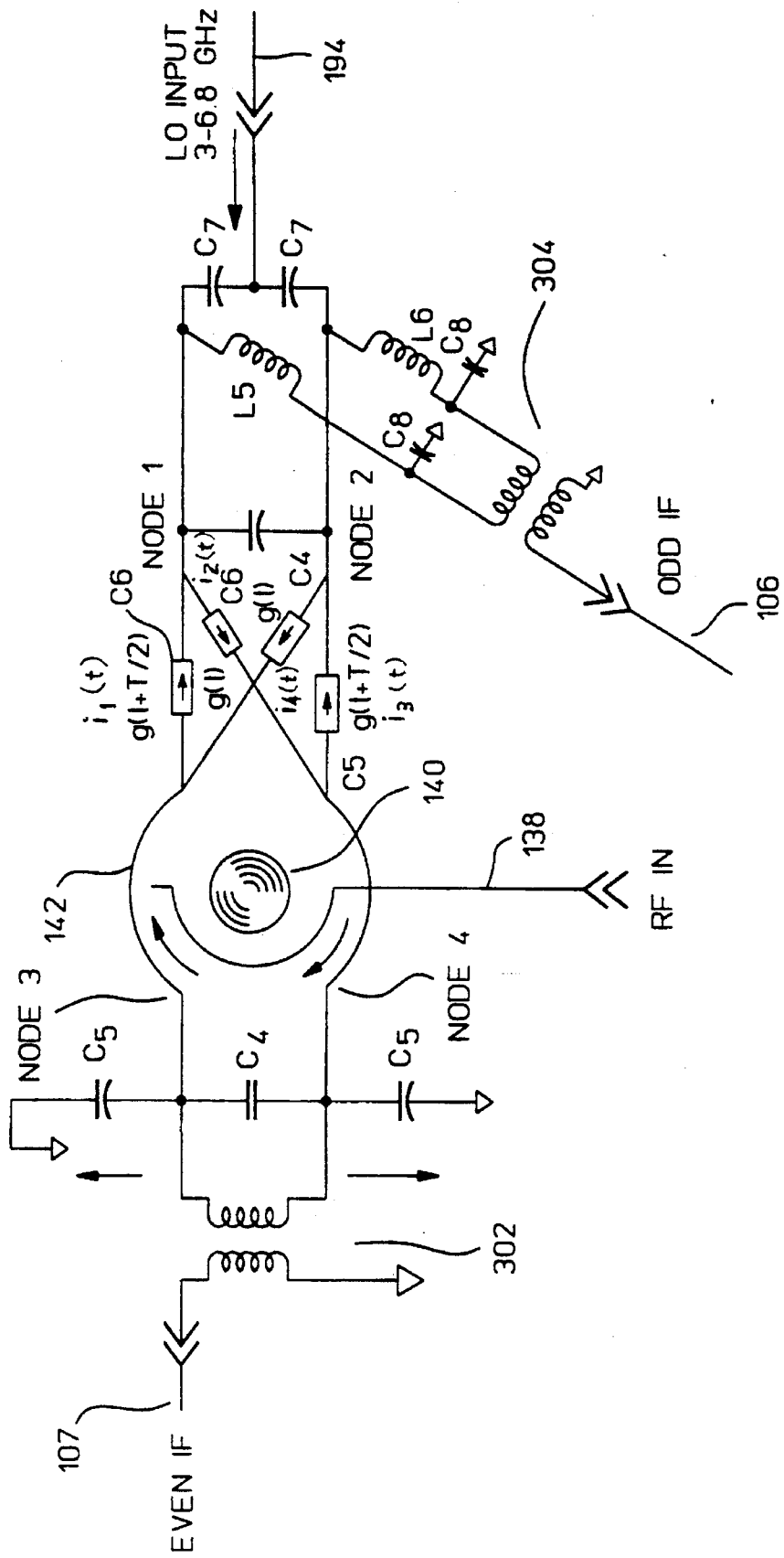

The signal paths of the LO, RF, and even and odd IF currents can be examined in greater detail in conjunction with the simplified schematic diagram of image-enhanced, double-balanced YIG-tuned mixer 105 shown in FIG. 9A. The LO signal is applied through capacitors $C_7$. A combination of inductors $L_5$ and $L_6$ and capacitors $C_8$ appears as a high impedance to the LO signal and has little effect on the LO signal power for this reason. The LO current flows through diodes $D_4$ and $D_6$ during the positive half cycle of the LO signal and through diodes $D_3$ and $D_5$ during the negative half cycle of the LO signal, which are in series with output coupling loop 142 and capacitors $C_5$, alternately forward biasing the respective diode pairs into their conducting states. The LO signal is isolated from the RF input comprising the second half loop of coupling loop 138, because full output coupling loop 142 is orthogonal to coupling loop 138. The LO current flows in a common mode through output coupling loop 142, and YIG sphere 140 is tuned to the frequency of the RF input signal. Each of the diodes $D_3$, $D_4$, $D_5$, and $D_6$ can be represented by a time-varying conductance, as indicated in FIG. 9B. Conductance g(t) represents the time-dependent conductance of diodes $D_4$ and $D_6$, as driven by the positive half cycle of the LO signal. Similarly, diodes $D_3$ and $D_5$ are driven by the negative half cycle of the LO signal and are represented by g(t+T/2), where T is the period of the LO signal.

The RF input signal from the third filter stage is applied to the second half loop of coupling loop 138. This induces a balanced, circulating RF current in full output coupling loop 142. Node 1, node 2, node 3, and node 4 are virtual ground ports for the RF input signal. Therefore, the RF input signal is isolated from both LO input 194 and odd and even IF ports 106 and 107.

As shown in FIG. 9B, the currents through diodes $D_3$, $D_4$, $D_5$, and $D_6$ are given by the following equations:

$$i_1(t) = V_{RF} \cdot g(t+T/2)$$

$$i_2(t) = V_{RF} \cdot g(t)$$

$$i_3(t) = -V_{RF} \cdot g(t+T/2)$$

$$i_4(t) = -V_{RF} \cdot g(t)$$

By performing the Fourier transforms of the above equations, one can analyze the currents at the frequencies of the LO signal, RF input signal, and all combinations of mixing products. The asterisk (*) symbol in the following equations represents a convolution function.

$$i_1(f) = V_{RF}(f) * G(f) \cdot \exp(j2\pi fT/2)$$

$$i_2(f) = V_{RF}(f) * G(f)$$

$$i_3(f) = -V_{RF}(f) * G(f) \cdot \exp(j2\pi fT/2)$$

$$i_4(f) = -V_{RF}(f) * G(f)$$

Figure 9C:
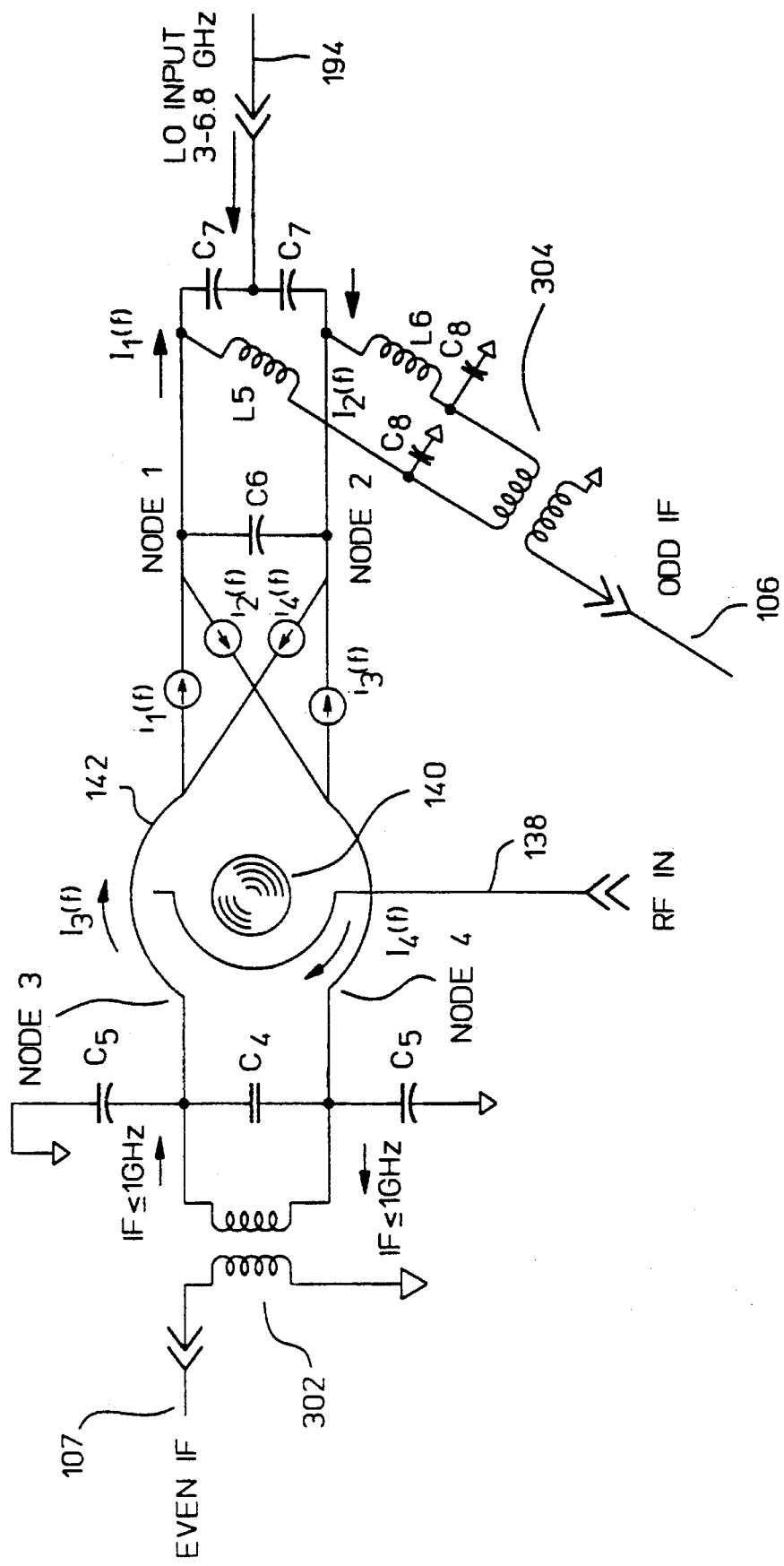

Currents $i_1(f)$, $i_2(f)$, $i_3(f)$, and $i_4(f)$ shown in FIG. 9C represent all possible mixing products between the LO signal and RF input signal in the frequency domain.

Currents $I_1(f)$, $I_2(f)$, $I_3(f)$, and $I_4(f)$ shown below are currents flowing out of the diode bridge $D_3$, $D_4$, $D_5$, and $D_6$ into nodes 1 through 4:

$$I_1(f) = i_1(f) - i_2(f) = V_{RF}(f) * G(f) [\exp(j\pi fT) - 1]$$

$$I_2(f) = i_4(f) - i_3(f) = V_{RF}(f) * G(f) [\exp(j\pi fT) - 1]$$

$$I_3(f) = i_1(f) - i_4(f) = V_{RF}(f) * G(f) [\exp(j\pi fT) + 1]$$

$$I_4(f) = i_2(f) - i_3(f) = V_{RF}(f) * G(f) [\exp(j\pi fT) + 1]$$

In the case of a spectrum analyzer, in which the LO is a pure sinusoidal signal, these equations can be reduced to the following:

$$I_1(f) = I_2(f) = V_{RF}(f) * \sum_{n=-\infty}^{n=+\infty} G(nf_{LO})[\exp(jn\Pi f_{LO}T) - 1] \quad (1)$$

$$I_3(f) = I_4(f) = V_{RF}(f) * \sum_{n=-\infty}^{n=+\infty} G(nf_{LO})[\exp(jn\Pi f_{LO}T) + 1] \quad (2)$$

In equations 1 and 2, since $f_{LO} = 1/T$, the expression [exp (jn $\pi f_{LO}T) - 1$] reduces to the expression [exp (jn $\pi) - 1$] which has a real part that is equal to zero when n corresponds to an even number. Also, the expression [exp (jn $\pi f_{LO}T) + 1$] reduces to the expression [exp (jn $\pi) + 1$] which has a real part equal to zero when n corresponds to an odd number. Equations 1 and 2 can be reduced to the following equations:

$$I_1(f) = I_2(f) = -2V_{RF}(f) * \sum_{k=-\infty}^{k=+\infty} G[(2k+1)f_{LO}] \quad (3)$$

$$I_3(f) = I_4(f) = 2V_{RF}(f) * \sum_{k=-\infty}^{k=+\infty} G[(2k)f_{LO}] \quad (4)$$

It is evident from equation 3 that the real part of the currents flowing into nodes 1 and 2 are only the odd harmonics of the LO signal mixing with the RF input signal. The even harmonic mixing products are cancelled. Similarly, it is evident from equation 4 that the real part of the currents flowing into nodes 3 and 4 are only the even harmonics of the LO signal that have mixed with the RF input signal. The odd harmonic mixing products are cancelled. Consequently, mixer 105 is a double-balanced mixer which operates as an odd and even harmonic mixer with odd and even harmonic ports that are isolated from each other.

The parametric values of the elements of routing circuit 102 and image-enhanced, double-balanced YIG-tuned mixer 105 depend upon the frequency range over which routing YIG-tuned resonator filter and mixer circuit 100 is intended to operate. In the case of one implementation of routing YIG-tuned resonator filter and mixer circuit 100 intended to operate from 0 to 26.5 GHz, the elements have the following parametric values:

Capacitors:
 $C_1 = 27$ pf
 $C_2 = 150$ pf
 $C_3 = 1500$ pf
 $C_4 = 6$ pf
 $C_5 = 4$ pf
 $C_6 = 4$ pf
 $C_7 = 5$ pf
 $C_8 = 4$ pf
Inductors:
 L ($L_1$, $L_2$, $L_3$, and $L_4$) = 40 nh
 $L_5 = 8$ nh
 $L_6 = 8$ nh
Resistors:
 $R_1 = 10 \Omega$
 $R_2 = 10 \Omega$ $R_3=350\Omega$ Such an implementation of routing YIG-tuned resonator filter and mixer circuit 100 provides a spectrum analyzer having improved sensitivity, typically <−144 dBm/Hz, and frequency response, typically <±2.2 dB.

Selecting the correct mixing product is performed by tuning preselector 104 to the frequency of an Rf input signal of interest, selecting the correct LO signal frequency, and switching IF switch 108 to the correct odd or even IF port 106 or 107. Referring to FIG. 7, an example of fundamental mixing is as follows:

$f_{RF}$=4 GHz (preselector 104 is tuned to 4 GHz)

$f_{LO}$=4.3 GHz

Node 1 and node 2: only odd harmonic mixing products $f_{IF}=(2n+1) f_{LO} \pm f_{RF}$ (There are no even harmonic mixing products at nodes 1 and 2.)

For n = 0,

| | | |
|---|---|---|
| 4.3 ± 4 GHz | 8.3 GHz | (recirculated by capacitor $C_6$) |
| | 0.3 GHz | (flows through IF balun 304) |

For n = 1,

| | | |
|---|---|---|
| 12 ± 4.3 GHz | 16.3 GHz | (recirculated by capacitor $C_6$) |
| | 7.7 GHz | (recirculated by capacitor $C_6$) |

There are no odd harmonic mixing products at node 5 and node 6. Node 5 and node 6: only even harmonic mixing products $f_{IF}=2nf_{LO} \pm f_{RF}$ (There are no odd harmonic mixing products at nodes 5 and 6.)

For n = 1,

| | | |
|---|---|---|
| 8.3 ± 4 GHz | 12.3 GHz | (recirculated by capacitor $C_4$) |
| | 4.3 GHz | (recirculated by capacitor $C_4$) |

For n=2, 3, 4, ..., m, the result is the same. Therefore, IF switch 108 is connected to odd IF port 106.

An example of second harmonic mixing is as follows:

$f_{RF}$=8.3 GHz (preselector 104 is tuned to 8.3 GHz)

$f_{LO}$=4 GHz second harmonic mixing

Node 1 and node 2: only odd harmonic mixing products $f_{IF}=(2n+1)f_{LO} \pm f_{RF}$ (There are no even harmonic mixing products at nodes 1 and 2.)

For n = 0,

| | | |
|---|---|---|
| 4 ± 8.3 GHz | 12.3 GHz | (recirculated by capacitor $C_6$) |
| | 4.3 GHz | (recirculated by capacitor $C_6$) |

For n = 1,

| | | |
|---|---|---|
| 12 ± 8.3 GHz | 20.3 GHz | (recirculated by capacitor $C_6$) |
| | 3.7 GHz | (recirculated by capacitor $C_6$) |

Node 5 and node 6: only even harmonic mixing products $f_{IF}=2nf_{LO} \pm f_{RF}$ (There are no odd harmonic mixing products at nodes 5 and 6.)

For n = 1,

| | | |
|---|---|---|
| |8 ± 8.3| GHz | 0.3 GHz | (flows to even IF balun 302) |
| | 16.3 GHz | (recirculated by capacitor $C_4$) |

For n = 2,

| | | |
|---|---|---|
| |16 ± 8.3| GHz | 24.3 GHz | (recirculated by capacitor $C_4$) |
| | 7.7 GHz | (recirculated by capacitor $C_4$) |

Therefore, IF switch 108 is connected to IF port 107.

The measured conversion loss of the above-described implementation of routing YIG-tuned resonator filter and mixer circuit 100 was 12 dB for fundamental mixing, 14 dB for second harmonic mixing, and 16 dB for fourth harmonic mixing. This conversion loss corresponds to the loss of routing circuit 102, preselector 104, mixer 105 including IF baluns 302 and 304, and IF switch 108. With routing circuit 102, preselector 104, IF baluns 302 and 304, and IF switch 108 removed, the result corresponds to a mixer having a conversion loss of approximately 4 dB for fundamental mixing, 6 dB for second harmonic mixing, and 8 dB for fourth harmonic mixing. This is a substantial improvement over existing biased harmonic mixers that typically have conversion losses of 8, 12, and 22 dB for fundamental, second, and fourth harmonic mixing, respectively. Additional improvements in insertion loss and flatness are also evident from integrating mixer 105 with preselector 104. Third order intercept (TOI) is typically greater than +20 dBm.

When routing YIG-tuned resonator filter and mixer circuit 100 is incorporated into a high-performance, portable microwave spectrum analyzer, sensitivity is improved as much as 16 dB for fourth harmonic mixing compared to previous harmonically mixed front ends. In comparison, this level of performance is surpassed at high frequency only by a fundamentally mixed spectrum analyzer, e.g., an HP 71210C modular spectrum analyzer available from Hewlett-Packard Company, Palo Alto, Calif.

Figure 10:
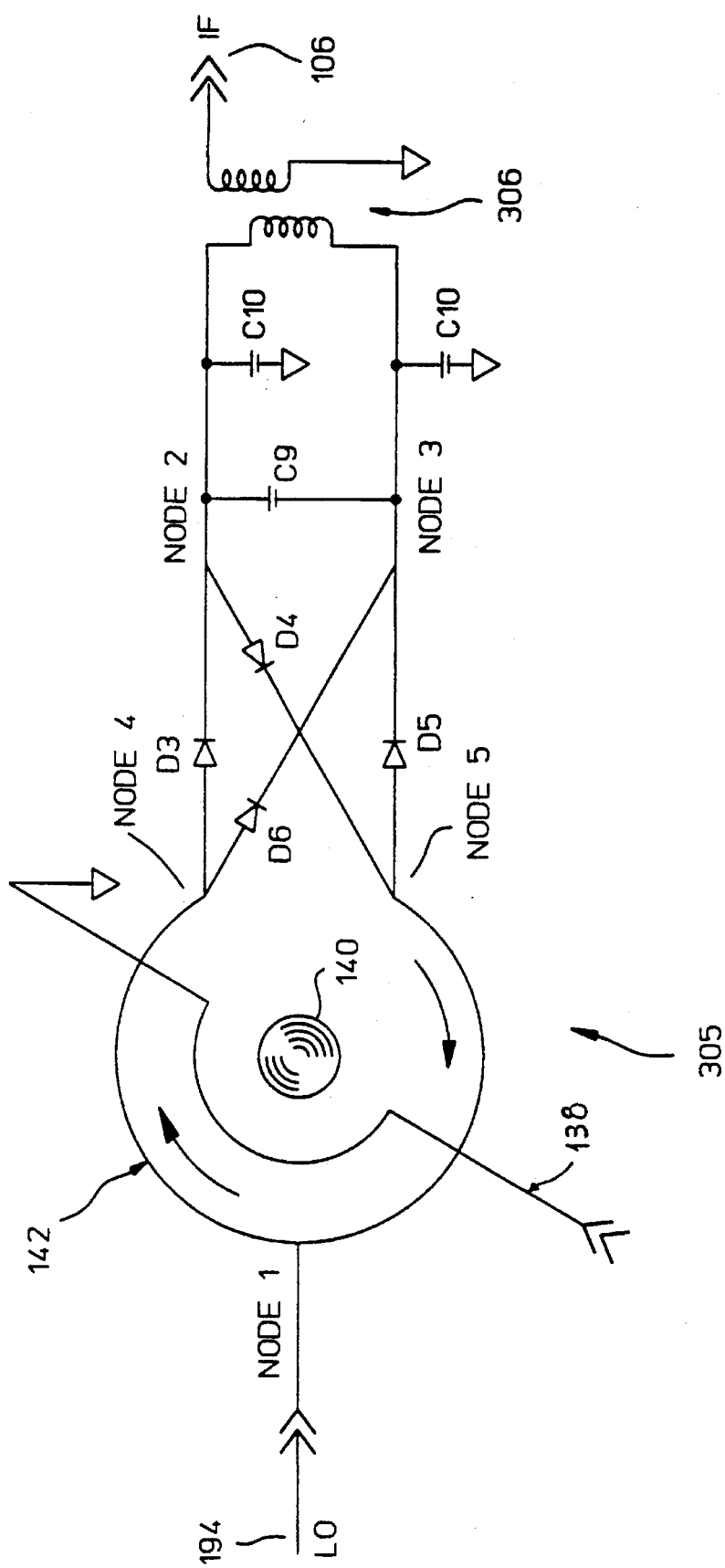
FIG. 10 is a schematic diagram of an embodiment of an image-enhanced, double-balanced YIG-tuned mixer which mixes a fundamental or odd harmonic products of a local oscillator signal with an RF input signal to produce a predetermined IF signal output.

While FIGS. 4, 7, 8, and 9 show an image-enhanced, double-balanced YIG-tuned mixer which provides a switched IF output signal based on odd or even harmonic mixing, FIG. 10 is a schematic diagram of an image-enhanced, double-balanced YIG-tuned mixer 305 which mixes a fundamental or odd harmonic products of the LO signal with the RF input signal to produce a predetermined low-frequency IF signal output. As shown in FIG. 10, mixer 305 comprises the second half loop of coupling loop 138 and full output coupling loop 142, in which output coupling loop 142 is continuous at a first end and connected to LO input 194. Output coupling loop 142 is terminated at a second end by a monolithic GaAs diode integrated circuit comprising a diode bridge including diodes $D_3$, $D_4$, $D_5$, and $D_6$. Diodes $D_3$, $D_4$, $D_5$, and $D_6$ are preferably Schottky diodes. Mixer 305 also comprises a capacitor $C_9$ connected across diode bridge $D_3$, $D_4$, $D_5$, and $D_6$. Mixer 305 further comprises a single IF balun 306 having an input connected across diode bridge $D_3$, $D_4$, $D_5$, and $D_6$. IF balun 306 functions as a fundamental and odd harmonic IF balun. An output of IF balun 306 is connected to odd IF port 106. Finally, mixer 305 comprises capacitors $C_{10}$ connected between the respective junctions of diode bridge $D_3$, $D_4$, $D_5$, and $D_6$ and IF balun 306, on the one hand, and ground, on the other hand. There is no even IF port 107 associated with mixer 305. Consequently, IF switch 108 is not needed. Capacitor $C_9$ is connected across diode bridge $D_3$, $D_4$, $D_5$, and $D_6$ to maintain the impedance between node 1 and node 2 very low for high frequency odd harmonic mixing products (e.g., ≧2 GHz), since interconnect inductance of capacitors $C_{10}$ could produce a high impedance across nodes 1 and 2. The inductance of full output coupling loop 142 is small enough (i.e., ≦0.4 nh) that currents produced by even harmonic mixing products are reflected back to mixer 305 without substantial phase change.

Considered in more detail, in the case of image-enhanced, double-balanced YIG-tuned mixer 305, a swept LO signal from 3 to 6.8 GHz or a broadband LO signal from 3 to 26.5 GHz, for example, could drive diode bridge $D_3$, $D_4$, $D_5$, and $D_6$ through node 1. The LO current return path is through capacitors $C_{10}$. An RF input signal from the second half loop of coupling loop 138 couples through YIG sphere 140 to produce a circulating RF current through full output coupling loop 142. The RF input signal mixes with the LO signal in diode bridge $D_3$, $D_4$, $D_5$, and $D_6$ and produces odd harmonic products at frequencies $(2n+1)f_{LO}\pm f_{RF}$. Node 1, node 2, and node 3 are virtual ground ports for the RF input signal. Therefore, LO input 194 and odd IF port 106 are isolated from the RF input comprised of the second half loop of coupling loop 138, and LO input 194 is isolated from the RF input and odd IF port 106. The IF signal is isolated from node 1. Harmonic mixing products at frequencies $(2n+1)f_{LO}\pm f_{RF}$, flow through node 2 and node 3, but node 1 is a virtual ground port for these mixing products. Also, at nodes 1, 2, and 3, even harmonic mixing products at frequencies $2nf_{LO}\pm f_{RF}$ are cancelled. Therefore, the only nodes to which odd order IF signals flow are node 2 and node 3, which are loaded by capacitors $C_9$ and $C_{10}$. The only mixing product that flows to odd IF port 106 is the low-frequency portion of the IF signal at a frequency $f_{IF}=(2n+1) f_{LO}-f_{RF}$, which is on order of 300 MHz, for example. All other mixing products, especially at frequencies $(_2n+1)f_{LO}+f_{RF}$, are rejected back and remixed to enhance the mixing product at the IF signal frequency $f_{IF}=(2n+1) f_{LO}-f_{RF}$.

Image-enhanced, double-balanced YIG-tuned mixer 305 provides only fundamental and odd harmonic mixing. Advantageously, odd harmonic mixing products are isolated (i.e., virtually grounded) at node 1.

In image-enhanced, double-balanced YIG-tuned mixer 305, all of the higher order mixing products are either short circuited through external capacitors or circuit topology (virtual ground ports). Consequently, image and multiple enhancement is provided, and better efficiency is therefore achieved. Also, RF and IF signals are fully balanced. Since IF signals are balanced, a return path through full output coupling loop 142 or through LO input 194 is not needed.

Figure 11A:
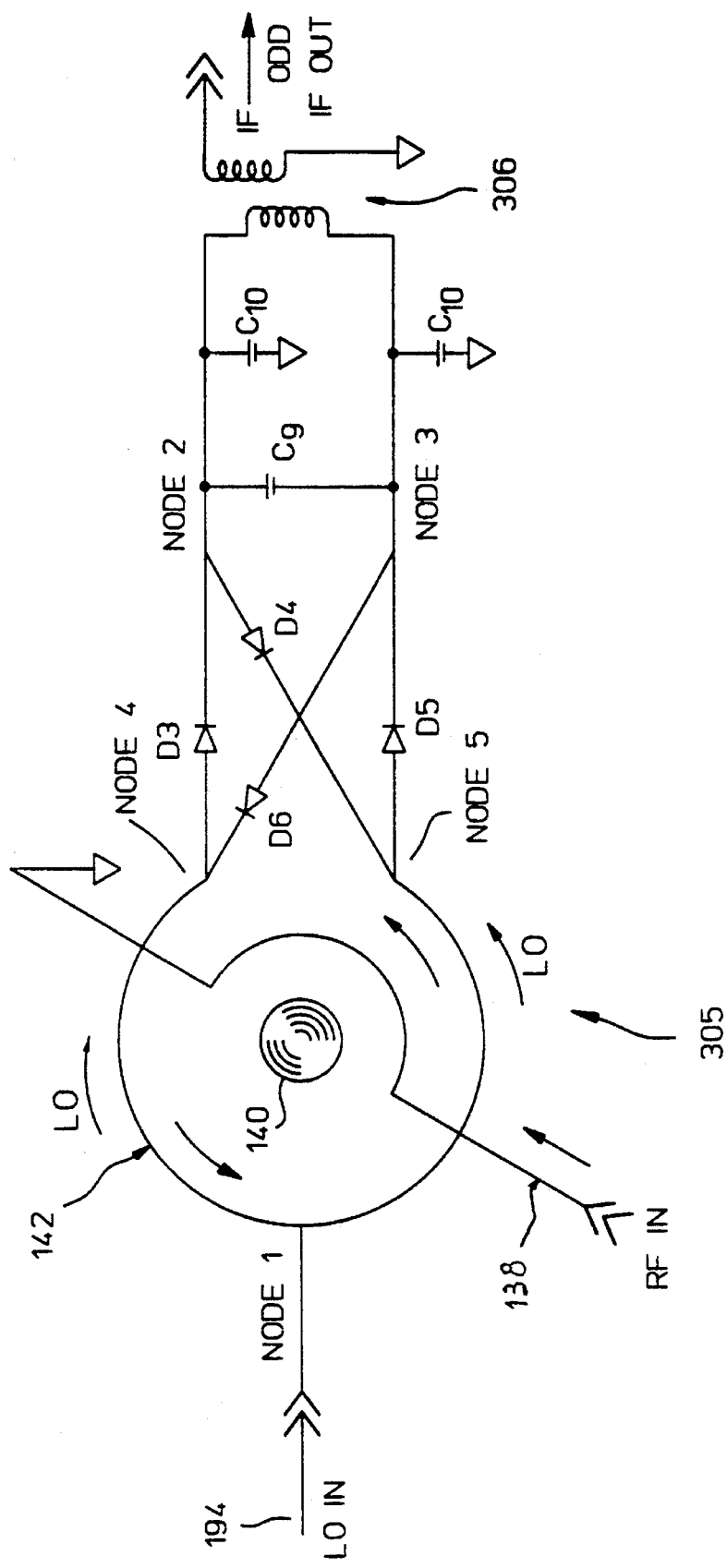
FIGS. 11A, 11B, and 11C, is a schematic diagram to facilitate an understanding of operation of the image-enhanced, double-balanced YIG-tuned mixer shown in FIG. 10.

The signal paths of the LO, RF, and odd IF currents can be examined in greater detail in conjunction with the simplified schematic diagram of image-enhanced, double-balanced YIG-tuned mixer 305 shown in FIG. 11A. The LO signal is applied through LO input 194 to full output coupling loop 142. The LO signal is divided equally between upper and lower halves of output coupling loop 142, flowing through diodes $D_3$ and $D_5$ during the positive half cycle of the LO signal and through diodes $D_4$ and $D_6$ during the negative half cycle of the LO signal, which are in series with output coupling loop 142 and capacitors $C_{10}$, biasing the respective diode pairs into their conducting states. The LO signal is isolated from the RF port comprising the second half loop of coupling loop 138, because output coupling loop 142 is orthogonal to coupling loop 138. The LO current flows in a common mode through the upper and lower halves of output coupling loop 142 (i.e., in the same direction), and YIG sphere 140 is tuned to the frequency of the RF input signal.

Figure 11B:
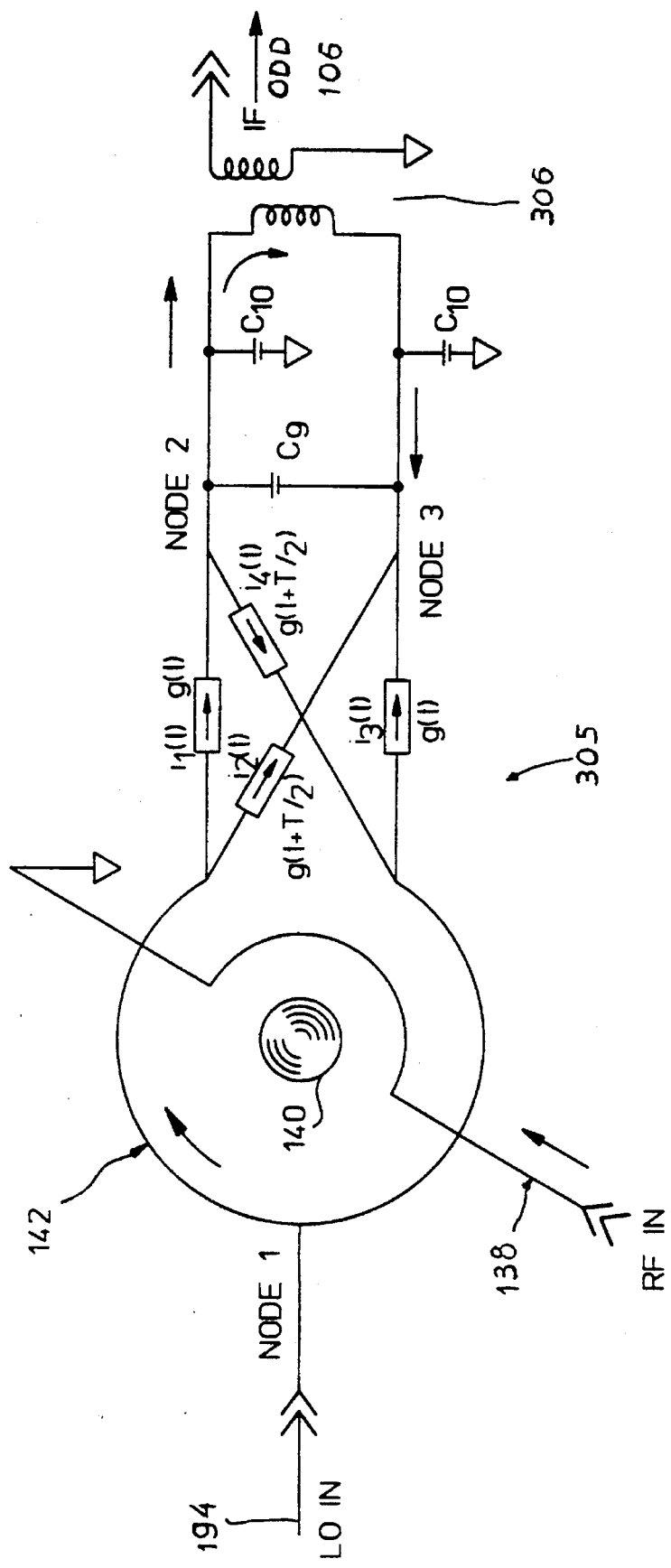

Each of the diodes $D_3$, $D_4$, $D_5$, and $D_6$ can be represented by a time-varying conductance, as indicated in FIG. 11B. Conductance g(t) represents the time-dependent conductance of diodes $D_3$ and $D_5$, as driven by the positive half cycle of the LO signal. Similarly, diodes $D_4$ and $D_6$ are driven by the negative half cycle of the LO signal and are represented by g (t+T/2), where T is the period of the LO signal.

The RF input signal from the third filter stage is applied to the second half loop of coupling loop 138. This induces a balanced, circulating RF current in full output coupling loop 142. Node 1, node 2, and node 3 are virtual ground ports for the RF input signal. Therefore, the RF input signal is isolated from both LO input 194 and odd IF port 106. As shown in FIG. 11B, the currents through diodes $D_3$, $D_4$, $D_5$, and $D_6$ are given by the following equations:

$$i_1\ (t)=V_{RF}\cdot g\ (t)$$

$$i_2\ (t)=V_{RF}\cdot g\ (t+T/2)$$

$$i_3\ (t)=-V_{RF}\cdot g\ (t)$$

$$i_4\ (t)=-V_{RF}\cdot g\ (t+T/2)$$

By performing the Fourier transforms of the above equations, one can analyze the currents at the frequencies of the LO signal, RF input signal, and all combinations of mixing products. The asterisk (*) symbol in the following equations represents a convolution function:

$$i_1\ (f)=V_{RF}\ (f)*G\ (f)$$

$$i_2\ (f)=V_{RF}\ (f)*G\ (f)\ \exp\ [(j2\ \pi fT/2)]$$

$$i_3\ (f)=-V_{RF}\ (f)*G\ (f)$$

$$i_4\ (f)=-V_{RF}\ (f)*G\ (f)\ \exp\ [(j2\ \pi fT/2)]$$

Figure 11C:
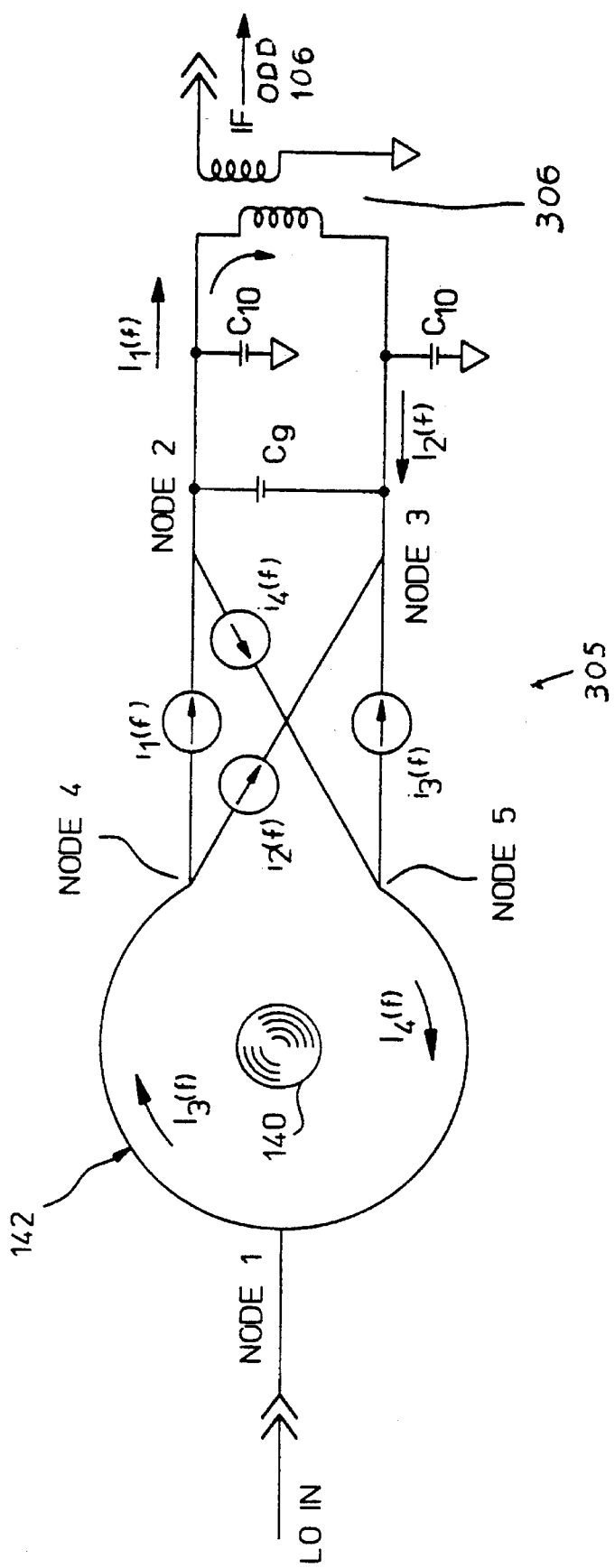

Currents $i_1$ (f), $i_2$ (f), $i_3$ (f), and $i_4$ (f) shown in FIG. 11C represent all possible mixing products between the LO signal and RF input signal in the frequency domain. Currents $I_1$ (f), $I_2$ (f), $I_3$ (f), and $I_4$ (f) shown below are currents flowing out of diode bridge $D_3$, $D_4$, $D_5$, and $D_6$ into node 4 and node 5 and in the upper and lower halves of full output coupling loop 142:

$$I_1\ (f)=i_1\ (f)-i_2\ (f)=V_{RF}\ (f)*G\ (f)\ [1-\exp\ (i\ \pi fT)]$$

$$I_2\ (f)=i_4\ (f)-i_3\ (f)=V_{RF}\ (f)*G\ (f)\ [1-\exp\ (j\ \pi fT)]$$

$$I_3\ (f)=i_1\ (f)-i_4\ (f)=V_{RF}\ (f)*G\ (f)\ [1+\exp\ (j\ \pi fT)]$$

$$I_4\ (f)=i_2\ (f)-i_3\ (f)=V_{RF}\ (f)*G\ (f)\ [1+\exp\ (j\ \pi fT)]$$

In the case of a spectrum analyzer, in which the LO is a pure sinusoidal signal, these equations can be reduced to the following equations:

$$I_1(f) = I_2(f) = V_{RF}(f) * \sum_{n=-\infty}^{n=+\infty} G(nf_{LO})[1 - \exp(jn\Pi f_{LO}T)] \quad (5)$$

$$I_3(f) = I_4(f) = V_{RF}(f) * \sum_{n=-\infty}^{n=+\infty} G(nf_{LO})[1 + \exp(jn\Pi f_{LO}T)] \quad (6)$$

In equations 5 and 6, since $f_{LO}=1/T$, the expression [1−exp (jn $\pi f_{LO}T$)] reduces to the expression [1−exp (jn $\pi$)] which has a real part that is equal to zero when n corresponds to an even number. Also, the expression [1+exp (jn $\pi f_{LO}T$)] reduces to the expression [1+exp (jn $\pi$)] which has a real part equal to zero when n corresponds to an odd number. Equations 5 and 6 can be reduced to the following equations:

$$I_1(f) = I_2(f) = 2V_{RF}(f) * \sum_{k=-\infty}^{k=+\infty} G[(2k+1)f_{LO}] \quad (7)$$

$$I_3(f) = I_4(f) = 2V_{RF}(f) * \sum_{k=-\infty}^{k=+\infty} G[(2k)f_{LO}] \quad (8)$$

It is evident from equation 7 that the real part of the currents flowing into nodes 2 and 3 are only the odd harmonics of the LO signal mixing with the RF input signal and at nodes 4 and 5 the odd harmonics of the LO signal mixing with the RF input signal are cancelled. This means that nodes 1, 4, and 5 are virtual grounds with respect to odd harmonic mixing products and odd harmonic mixing products do not require any return path through node 1. Therefore, odd harmonic mixing products can be extracted from nodes 2 and 3 through odd IF balun 306. Likewise, it is evident from equation 8 that the real part of the currents flowing into nodes 4 and 5 are only the even harmonics of the LO signal that have mixed with the RF input signal. The odd harmonic mixing products are cancelled. Consequently, mixer 305 is a double-balanced mixer which operates as a fundamental and odd harmonic mixer.

To achieve image- and multiple-mixing-product enhancement, capacitors $C_9$ and $C_{10}$ are incorporated at nodes 2 and 3. Consequently, high-frequency odd mixing products (i.e., >2 GHz) are reflected back to mixer 305 to remix. Also, node 1 produces a short to even harmonic mixing currents $I_3$ (f) and $I_4$ (f), reflecting them back to mixer 305 to remix. This results in a highly efficient mixer. The only mixing product that is allowed to flow to odd IF port 106 is a predetermined low-frequency IF signal (i.e., $f_{IF} \ll 1$ GHz).

Figure 12:
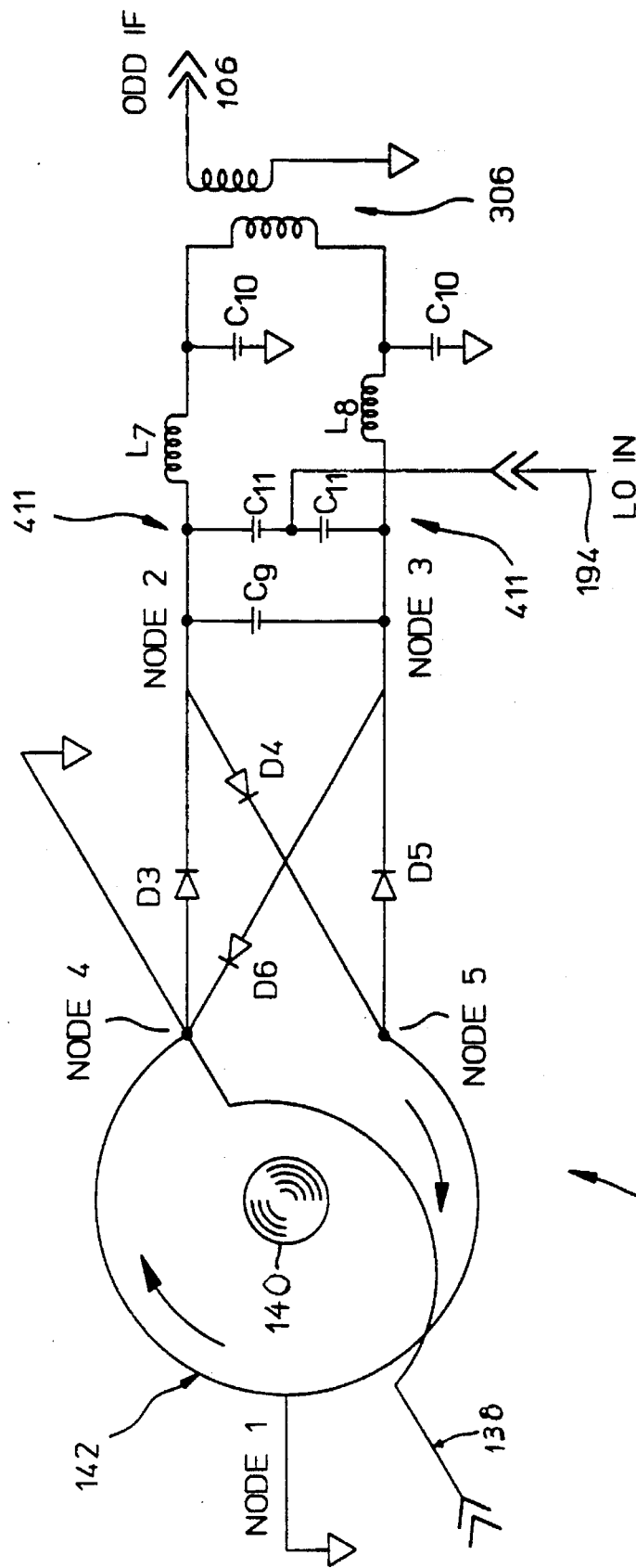
FIG. 12 is a schematic diagram of an alternate embodiment of an image-enhanced, double-balanced YIG-tuned mixer which mixes a fundamental or odd harmonic products of a local oscillator signal with an RF input signal to produce a predetermined IF signal output.

FIG. 12 shows an alternate image-enhanced, double-balanced mixer 405 which mixes a fundamental or odd harmonic products of the LO signal with an RF input signal to produce the predetermined low-frequency IF signal output. In contrast to mixer 305 shown in FIG. 10, the LO signal is injected at a different location in mixer 405 shown in FIG. 12.

In image-enhanced, double-balanced YIG-tuned mixer 405 shown in FIG. 12, the first end of full output coupling loop 142 is connected to ground. Mixer 405 additionally comprises capacitors $C_{11}$ connected in series across capacitor $C_9$. The junction between capacitors $C_{11}$ is connected to LO input 194. Mixer 405 also comprises inductors $L_7$ and $L_8$ having first ends connected to the respective junctions of capacitor $C_9$, on the one hand, and capacitors $C_{11}$, on the other hand. The second ends of inductors $L_7$ and $L_8$ are connected to the respective junctions of capacitors $C_{10}$, on the one hand, and IF balun 306, on the other hand.

Figure 13A:
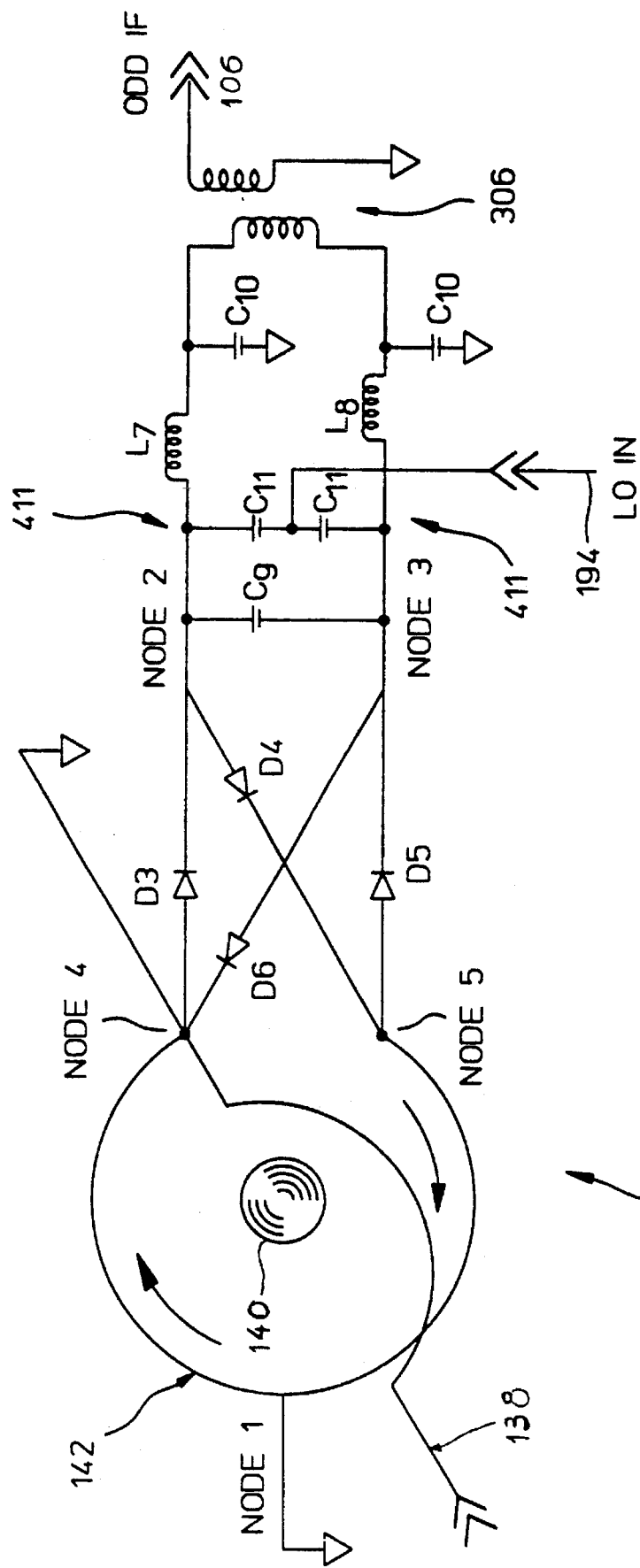
FIGS. 13A, 13B, and 13C, is a schematic diagram to facilitate an understanding of operation of the image-enhanced, double-balanced YIG-tuned mixer shown in FIG. 12.

The signal paths of the LO, RF, and odd IF currents can be examined in greater detail in conjunction with the simplified schematic diagram of image-enhanced, double-balanced YIG-tuned mixer 405 shown in FIG. 13A. The LO signal is applied through the junction of capacitors $C_{11}$. The combination of inductors $L_7$ and $L_8$ and capacitors $C_{10}$ provides a high impedance load for the LO signal at nodes 2 and 3. Therefore, the LO signal flows through diodes $D_4$ and $D_6$ during the positive half cycle of the LO signal and through diodes $D_3$ and $D_5$ during the negative half cycle of the LO signal, which are in series with output coupling loop 142 grounded through node 1, biasing the respective diode pairs into their conducting states. The LO signal is isolated from the RF port comprising the second half loop of coupling loop 138, because output coupling loop 142 is orthogonal to coupling loop 138. The LO current flows in a common mode through the upper and lower halves of output coupling loop 142 (i.e., in the same direction), and YIG sphere 140 is tuned to the frequency of the RF input signal.

Figure 13B:
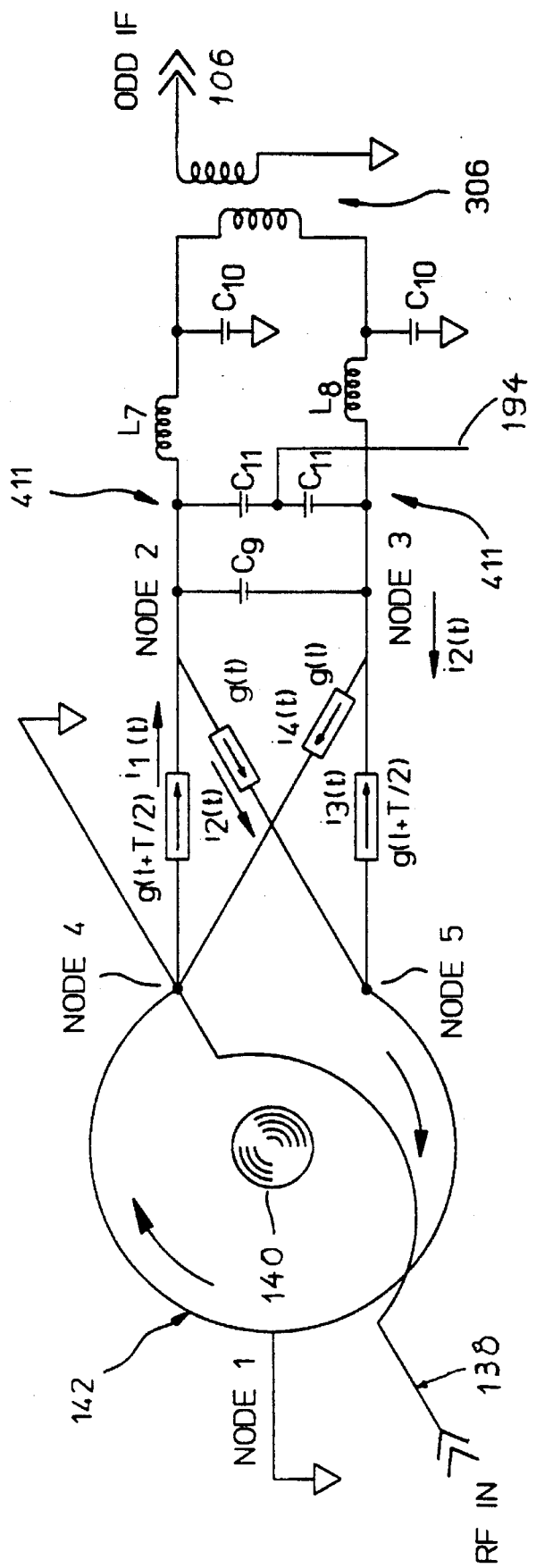

Each of the diodes $D_3$, $D_4$, $D_5$, and $D_6$ can be represented by a time-varying conductance, as indicated in FIG. 13B. Conductance g(t) represents the time-dependent conductance of diodes $D_4$ and $D_6$, as driven by the positive half cycle of the LO signal. Similarly, diodes $D_3$ and $D_5$ are driven by the negative half cycle of the LO signal and are represented by g (t+T/2), where T is the period of the LO signal.

The RF input signal from the third filter stage is applied to the second half loop of coupling loop 138. This induces a balanced, circulating RF current in full output coupling loop 142. Node 1, node 2, and node 3 are virtual ground ports for the RF input signal. Therefore, the RF input signal is isolated from both LO input 194 and odd IF port 106. As shown in FIG. 13B, the currents through diodes $D_3$, $D_4$, $D_5$, and $D_6$ are given by the following equations:

$i_1(t) = V_{RF} \cdot g(t+T/2)$ $i_2(t) = V_{RF} \cdot g(t)$ $i_3(t) = -V_{RF} \cdot g(t+T/2)$ $i_4(t) = -V_{RF} \cdot g(t)$ By performing the Fourier transforms of the above equations, one can analyze the currents at the frequencies of the LO signal, RF input signal, and all combinations of mixing products. The asterisk (*) symbol in the following equations represents a convolution function.

Figure 13C:
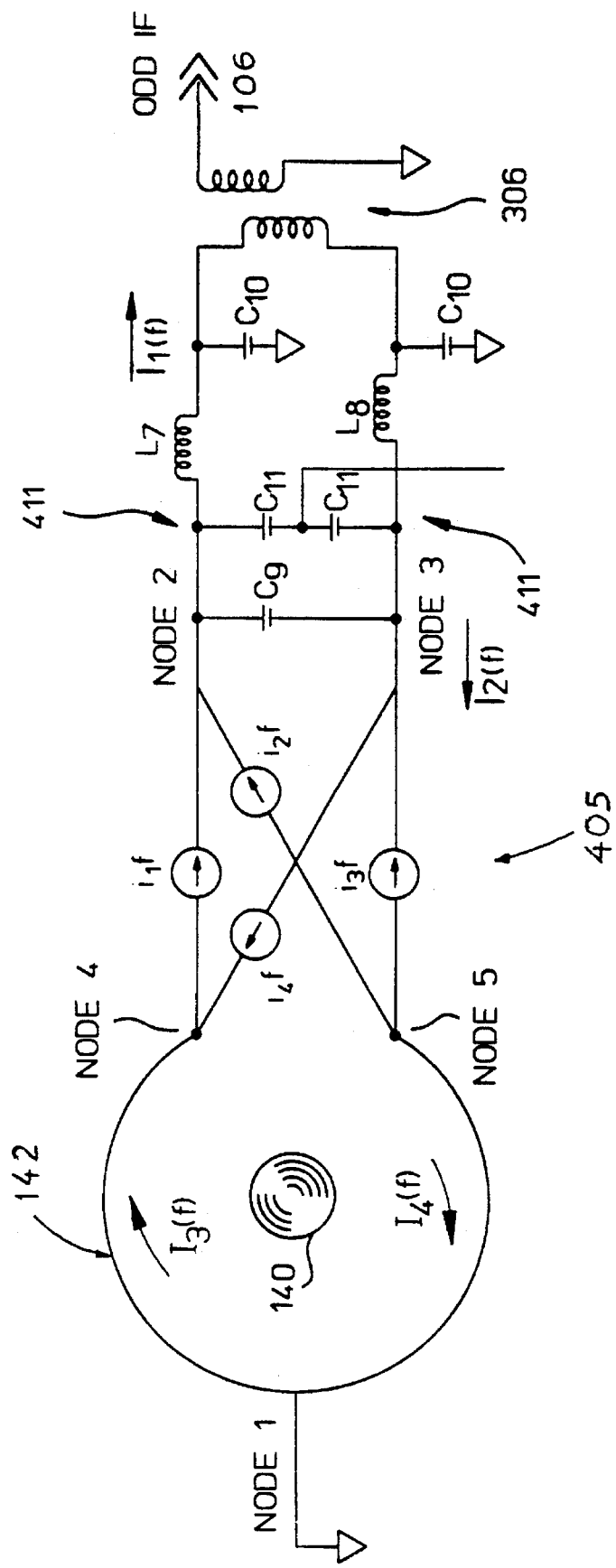

$i_1(f) = V_{RF}(f) * G(f) \exp[(j2\pi fT/2)]$ $i_2(f) = V_{RF}(f) * G(f)$ $i_3(f) = -V_{RF}(f) * G(f) \exp[(j2 \pi fT/2)]$ $i_4(f) = -V_{RF}(f) * G(f)$ Currents $i_1$ (f), $i_2$ (f), $i_3$ (f), and $i_4$ (f) shown in FIG. 13C represent all possible mixing products between the LO signal and RF input signal in the frequency domain.

Currents $I_1$ (f), $I_2$ (f), $I_3$ (f), and $I_4$ (f) shown below are currents flowing out of diode bridge $D_3$, $D_4$, $D_5$, and $D_6$ into node 4 and node 5 and in the upper and lower halves of full output coupling loop 142:

$I_1(f) = i_1(f) - i_2(f) = V_{RF}(f) * G(f) [\exp(j \pi fT) - 1]$ $I_2(f) = i_4(f) - i_3(f) = V_{RF}(f) * G(f) [\exp(j \pi fT) - 1]$ $I_3(f) = i_1(f) - i_4(f) = V_{RF}(f) * G(f) [1 + \exp(j \pi fT)]$ $I_4(f) = i_2(f) - i_3(f) = V_{RF}(f) * G(f) [1 + \exp(j \pi fT)]$ In the case of a spectrum analyzer, in which the LO is a pure sinusoidal signal, these equations can be reduced to the following equations:

$$I_1(f) = I_2(f) = V_{RF}(f) * \sum_{n=-\infty}^{n=+\infty} G(nf_{LO})[\exp(jn\Pi f_{LO}T) - 1] \quad (9)$$

$$I_3(f) = I_4(f) = V_{RF}(f) * \sum_{n=-\infty}^{n=+\infty} G(nf_{LO})[1 + \exp(jn\Pi f_{LO}T)] \quad (10)$$

In equations 9 and 10, since $f_{LO} = 1/T$, the expression [exp (jn $\pi f_{LO}T$)−1] reduces to the expression [exp (jn π)−1] which has a real part that is equal to zero when n corresponds to an even number. Also, the expression [1+exp (jn $\pi f_{LO}T$)] reduces to the expression [1+exp (jn π)] which has a real part equal 986 to zero when n corresponds to an odd number. Equations 9 and 10 can be reduced to the following equations:

$$I_1(f) = I_2(f) = 2V_{RF}(f) * \sum_{k=-\infty}^{k=+\infty} G[(2k+1)f_{LO}] \quad (11)$$

$$I_3(f) = I_4(f) = 2V_{RF}(f) * \sum_{k=-\infty}^{k=+\infty} G[(2k)f_{LO}] \quad (12)$$

It is evident from equation 11 that the real part of the currents flowing into nodes 2 and 3 are only the odd harmonics of the LO signal mixing with the RF input signal and at nodes 4 and 5 the odd harmonics of the LO signal mixing with the RF input signal are cancelled. This means that nodes 1, 4, and 5 are virtual grounds with respect to odd harmonic mixing products and odd harmonic mixing products do not require any return path through node 1. Therefore, odd harmonic mixing products can be extracted from nodes 2 and 3 through odd IF balun 306. Likewise, it is evident from equation 12 that the real part of the currents flowing into nodes 4 and 5 are only the even harmonics of the LO signal that have mixed with the RF input signal. The odd harmonic mixing products are cancelled. Consequently, mixer 405 is a double-balanced mixer which operates as a fundamental and odd harmonic mixer. To achieve image- and multiple-mixing-product enhancement, capacitor $C_9$ is incorporated at nodes 2 and 3. Consequently, high-frequency odd mixing products (i.e., $\geq 2$ GHz) are reflected back to mixer 405 to remix. Also, node i produces a short circuit to even harmonic mixing currents $I_3$ (f) and $I_4$ (f), reflecting them back to mixer 405 to remix. This results in a highly efficient mixer. The only mixing product that is allowed to flow to odd IF port 106 is a predetermined low-frequency IF signal (i.e., $f_{IF} \ll 1$ GHz).

Figure 14:
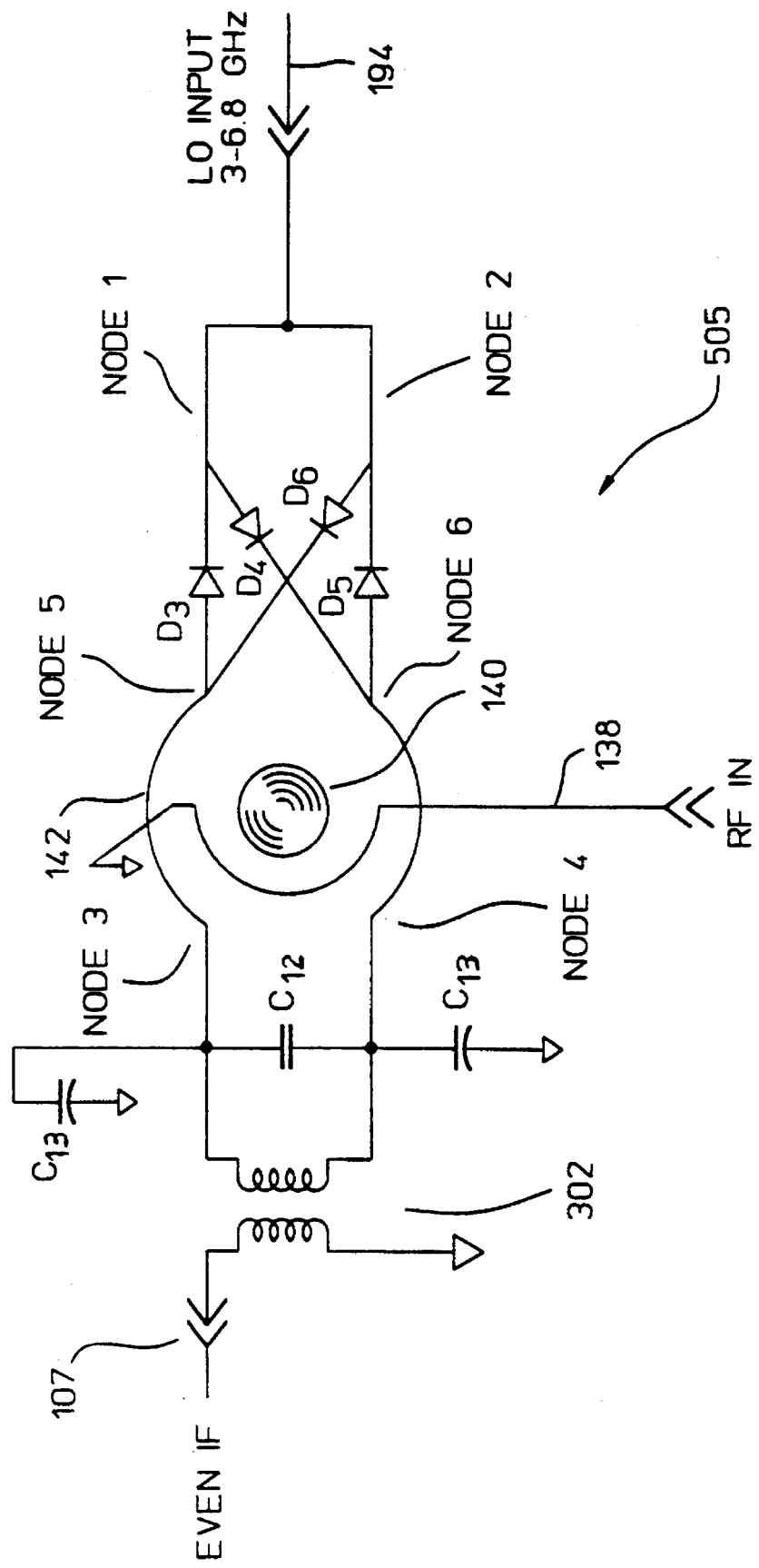
FIG. 14 is a schematic diagram of an embodiment of an image-enhanced, double-balanced YIG-tuned mixer which mixes even harmonic products of a local oscillator signal with an RF input signal to produce a predetermined IF signal output.

While FIGS. 4, 7, 8, and 9 show an image-enhanced, double-balanced YIG-tuned mixer which provides a switched IF output signal based on odd or even harmonic mixing, FIG. 14 is a schematic diagram of an image-enhanced, double-balanced YIG-tuned mixer 505 which mixes even harmonic products of the LO signal with the RF input signal to produce a predetermined low-frequency IF signal output. As shown in FIG. 14, mixer 505 comprises the second half loop of coupling loop 138 and full output coupling loop 142, in which output coupling loop 142 is terminated at a first end by a capacitor $C_{12}$ and terminated at a second end by a monolithic GaAs diode integrated circuit comprising a diode bridge including diodes $D_3$, $D_4$, $D_5$, and $D_6$. Diodes $D_3$, $D_4$, $D_5$, and $D_6$ are preferably Schottky diodes. LO input 194 is connected across diode bridge $D_3$, $D_4$, $D_5$, and $D_6$. Mixer 505 further comprises a single IF balun 302 having an input connected across capacitor $C_{12}$. IF balun 302 functions as an even harmonic IF balun. An output of IF balun 302 is connected to even IF port 107. Finally, mixer 505 comprises capacitors $C_{13}$ connected between the respective junctions of capacitor $C_{12}$ and IF balun 302, on the one hand, and ground, on the other hand. There is no odd IF port 106 associated with mixer 505. Consequently, IF switch 108 is not needed.

The LO signal is fed into image-enhanced, double-balanced YIG-tuned mixer 505 through node 1 and node 2. The return path for the LO current is through capacitors $C_{13}$. The RF current flows through full output coupling loop 142 and capacitor $C_{12}$ and mixes with the LO signal in diode bridge $D_3$, $D_4$, $D_5$, and $D_6$. Nodes 1 and 2 are virtual ground ports for the RF input signal. Therefore, the return path for the RF current is a closed loop through diodes $D_3$, $D_4$, $D_5$, and $D_6$. Odd harmonic mixing products only flow out of node 1 and into node 2. Consequently, LO input 194 is a virtual ground port with respect to odd IF mixing products. Therefore, the IF and LO signals are isolated. At the same time, since nodes 1 and 2 are connected together, all odd harmonic mixing products are reflected back to diode bridge $D_3$, $D_4$, $D_5$, and $D_6$ and remix to provide higher efficiency. Diodes $D_3$ and $D_6$ are anti-parallel with respect to the LO and RF signals and therefore produce even harmonic mixing products at frequencies $2nf_{LO} \pm f_{RF}$ that flow into node 3 with respect to the direction of RF current flow. Also, diodes $D_4$ and $D_5$ are anti-parallel with respect to the RF and LO signals and therefore produce even harmonic mixing products at frequencies $2nf_{LO} \pm f_{RF}$ that flow out of node 4. At the same time, nodes 1 and 2 are virtual ground ports with respect to even harmonic mixing products.

Even harmonic mixing products that circulate through full output coupling loop 142 appear across capacitor $C_{12}$ which at the predetermined low-frequency IF, e.g., on the order of 300 MHZ, appears as a high impedance. Therefore, the predetermined low-frequency IF flows out of node 4 through IF balun 302 into node 3 to the upper half of full output coupling loop 142 into node 5. High frequency even mixing products circulate through output coupling loop 142 and capacitor $C_{12}$. Since the length of output coupling loop 142 is very short, e.g., $\leq \lambda 16$ at 26.5 GHz, all high frequency even mixing products are effectively short circuited across nodes 3 and 4, producing the effect of image enhancement for higher efficiency. Therefore, mixer 505 is a double-balanced mixer in which even harmonic mixing products are isolated from nodes 1 and 2 connected to LO input 194 and provides image and multiple enhancement mixing for high efficiency.

Figure 15A:
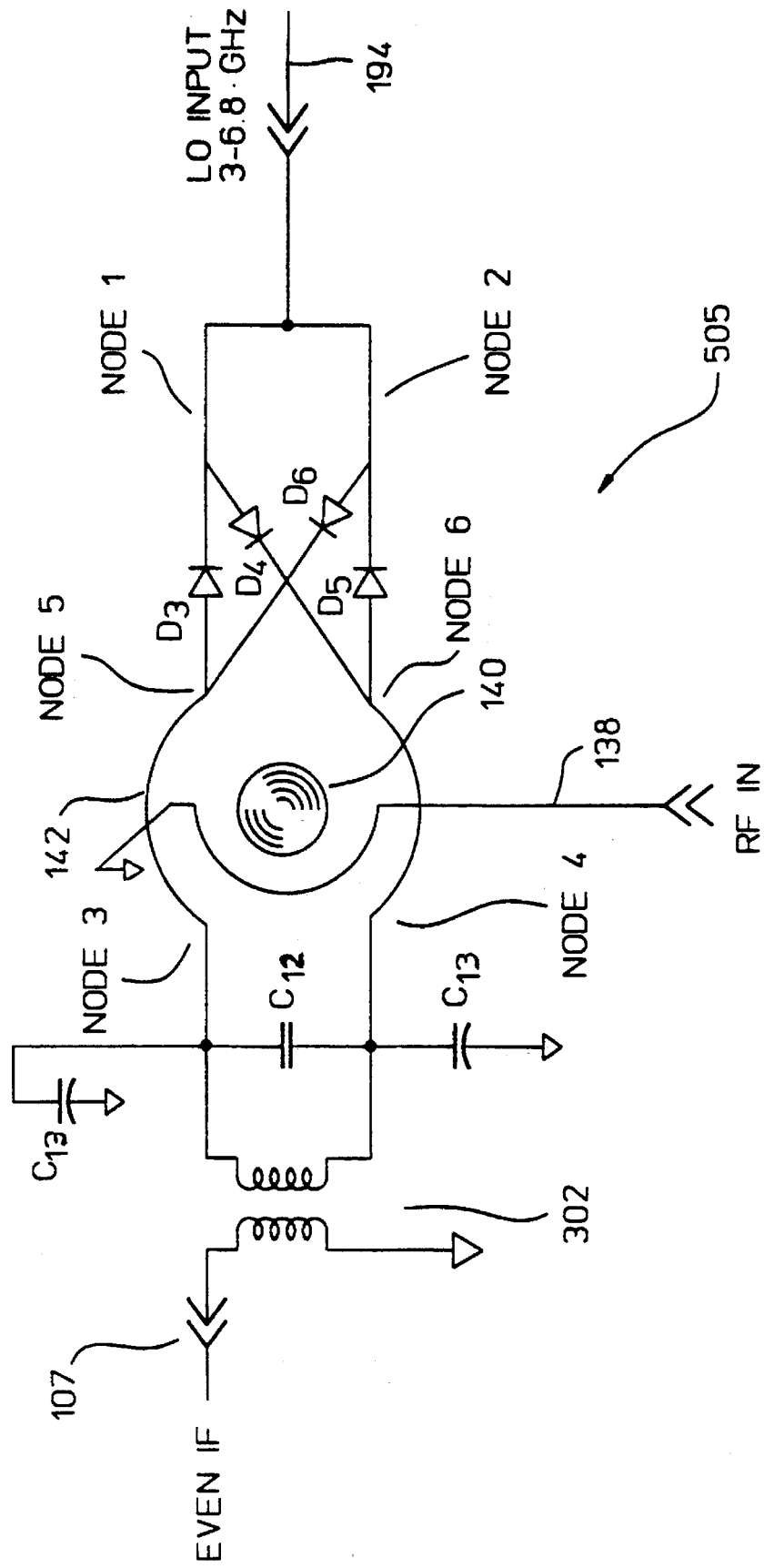
FIGS. 15A, 15B, and 15C, is a schematic diagram to facilitate an understanding of operation of the image-enhanced, double-balanced YIG-tuned mixer shown in FIG. 14.

The signal paths of the LO, RF, and even IF currents can be examined in greater detail in conjunction with the simplified schematic diagram of image-enhanced, double-balanced YIG-tuned mixer 505 shown in FIG. 15A. The LO signal is applied through LO input 194 to diode bridge $D_3$, $D_4$, $D_5$, and $D_6$. The LO signal flows through diodes $D_4$ and $D_6$ during the positive half cycle of the LO signal and through diodes $D_3$ and $D_5$ during the negative half cycle of the LO signal, which are in series with output coupling loop 142 and capacitors $C_{13}$, biasing the respective diode pairs into their conducting states. The LO signal is isolated from the RF port comprising the second half loop of coupling loop 138, because output coupling loop 142 is orthogonal to coupling loop 138. The LO current flows in a common mode through the upper and lower halves of output coupling loop 142 (i.e., in the same direction), and YIG sphere 140 is tuned to the frequency of the RF input signal.

Figure 15B:
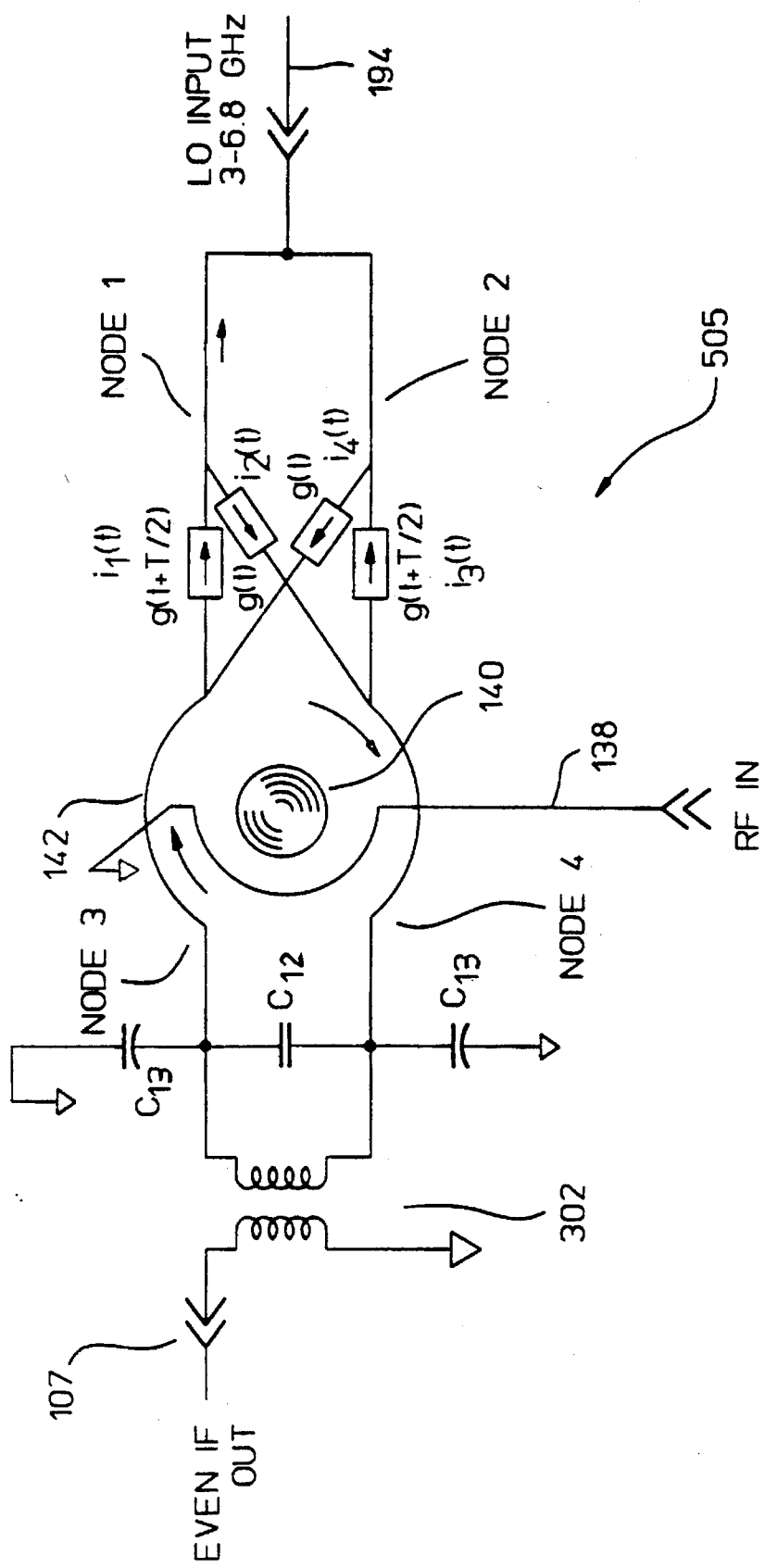

Each of the diodes $D_3$, $D_4$, $D_5$, and $D_6$ can be represented by a time-varying conductance, as indicated in FIG. 15B. Conductance g(t) represents the time-dependent conductance of diodes $D_4$ and $D_6$, as driven by the positive half cycle of the LO signal. Similarly, diodes $D_3$ and $D_5$ are driven by the negative half cycle of the LO signal and are represented by g (t+T/2), where T is the period of the LO signal.

The RF input signal from the third filter stage is applied to the second half loop of coupling loop 138. This induces a balanced, circulating RF current in full output coupling loop 142. Node 1, node 2, node 3, and node 4 are virtual ground ports for the RF input signal. Therefore, the RF input signal is isolated from both LO input 194 and even IF port 107. As shown in FIG. 15B, the currents through diodes $D_3$, $D_4$, $D_5$, and $D_6$ are given by the following equations:

$i_1 (t) = V_{RF} \cdot g (t+T/2)$ $i_2 (t) = V_{RF} \cdot g (t)$ $i_3 (t) = -V_{RF} \cdot g (t+T/2)$ $i_4 (t) = -V_{RF} \cdot g (t)$ By performing the Fourier transforms of the above equations, one can analyze the currents at the frequencies of the LO signal, RF input signal, and all combinations of mixing products. The asterisk (*) symbol in the following equations represents a convolution function.

Figure 15C:
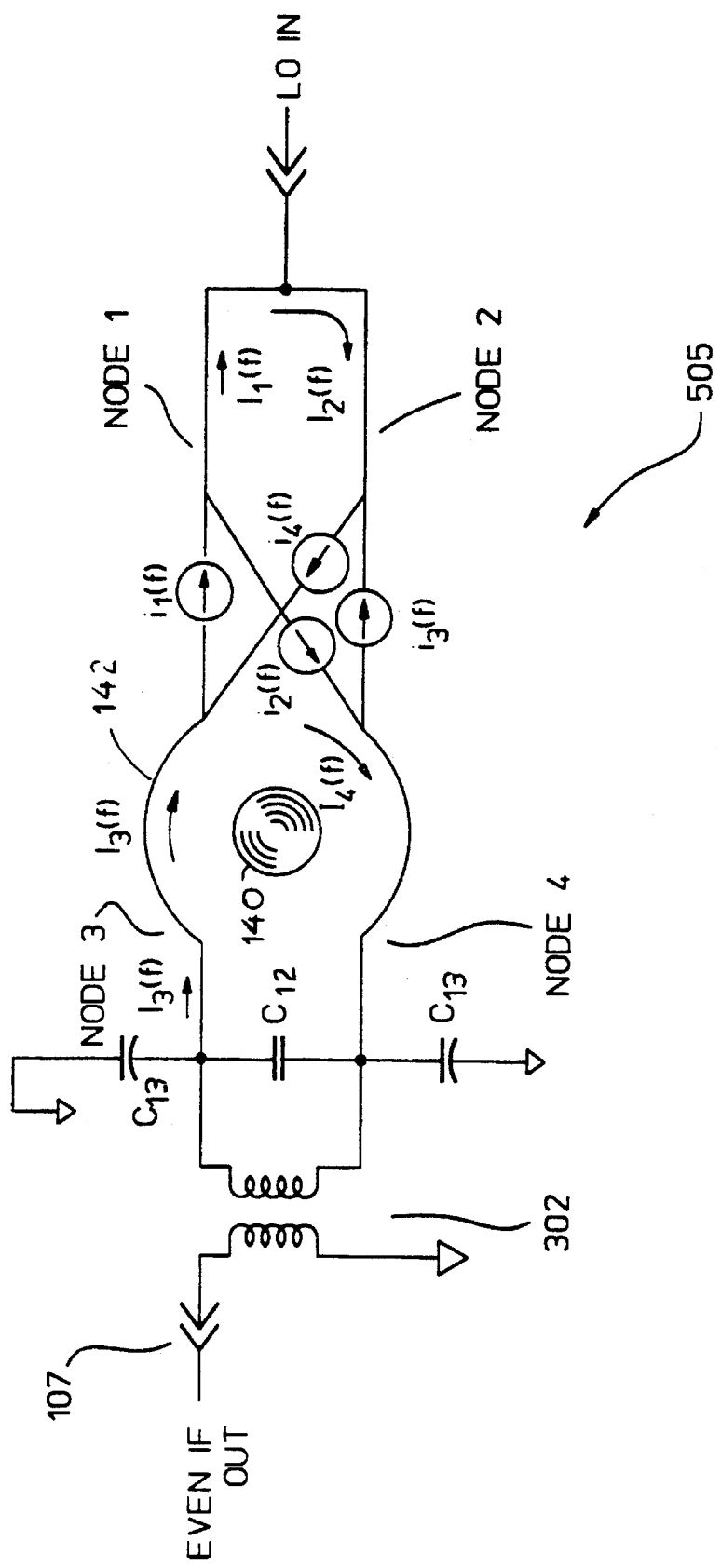

$i_1 (f) = V_{RF} (f) * G (f) \exp [(j2\pi fT/2)]$ $i_2 (f) = V_{RF} (f) * G (f)$ $i_3 (f) = -V_{RF} (f) * G (f) \exp [(j2\pi fT/2)]$ $i_4 (f) = -V_{RF} (f) * G (f)$ Currents $i_1(f)$, $i_2(f)$, $i_3(f)$, and $i_4(f)$ shown in FIG. 15C represent all possible mixing products between the LO signal and RF input signal in the frequency domain.

Currents $I_1(f)$, $I_2(f)$, $I_3(f)$, and $I_4(f)$ shown below are currents flowing out of diode bridge $D_3$, $D_4$, $D_5$, and $D_6$ into node 1 and node 2 and in the upper and lower halves of full output coupling loop 142:

$$I_1(f) = i_1(f) - i_2(f) = V_{RF}(f) * G(f) [\exp(j\pi fT) - 1]$$

$$I_2(f) = i_4(f) - i_3(f) = V_{RF}(f) * G(f) [\exp(j\pi fT) - 1]$$

$$I_3(f) = i_1(f) - i_4(f) = V_{RF}(f) * G(f) [1 + \exp(j\pi fT)]$$

$$I_4(f) = i_3(f) = V_{RF}(f) * G(f) [1 + \exp(j\pi fT)]$$

In the case of a spectrum analyzer, in which the LO is a pure sinusoidal signal, these equations can be reduced to the following equations:

$$I_1(f) = I_2(f) = V_{RF}(f) * \sum_{n=-\infty}^{n=+\infty} G(nf_{LO})[\exp(jn\Pi f_{LO}T) - 1] \quad (13)$$

$$I_3(f) = I_4(f) = V_{RF}(f) * \sum_{n=-\infty}^{n=+\infty} G(nf_{LO})[1 + \exp(jn\Pi f_{LO}T)] \quad (14)$$

In equations 13 and 14, since $f_{Lo} = 1/T$, the expression [exp $(jn \pi f_{Lo}) - 1$] reduces to the expression [exp $(jn \pi) - 1$] which has a real part that is equal to zero when n corresponds to an even number. Also, the expression $[1 + \exp(jn \pi f_{Lo}T)]$ reduces to the expression $[1 + \exp(jn \pi)]$ which has a real part equal to zero when n corresponds to an odd number. Equations 13 and 14 can be reduced to the following equations:

$$I_1(f) = I_2(f) = 2V_{RF}(f) * \sum_{k=-\infty}^{k=+\infty} G[(2k+1)f_{LO}] \quad (15)$$

$$I_3(f) = I_4(f) = 2V_{RF}(f) * \sum_{k=-\infty}^{k=+\infty} G[(2k)f_{LO}] \quad (16)$$

It is evident from equation 15 that the real part of the currents flowing into nodes 1 and 2 are only the odd harmonics of the LO signal mixing with the RF input signal and at nodes 3 and 4 the odd harmonics of the LO signal mixing with the RF input signal are cancelled. This means that nodes 3 and 4 are virtual grounds with respect to odd harmonic mixing products. Likewise, it is evident from equation 16 that the real part of the currents flowing into nodes 3 and 4 are only the even harmonics of the LO signal that have mixed with the RF input signal. At nodes 1 and 2, even harmonics of the LO signal that mix with the RF input signal are cancelled. This means that nodes 1 and 2 are virtual ground ports with respect to even harmonic mixing products and even harmonic mixing products do not require a return path through nodes 1 and 2. Therefore, even harmonic mixing products can be extracted from nodes 3 and 4 by even IF balun 302.

To achieve image- and multiple-mixing-product enhancement, capacitors $C_{12}$ and $C_{13}$ are incorporated at nodes 3 and 4. Consequently, high-frequency even mixing products (i.e., >2 GHz) are reflected back to mixer 505 to remix. Also, nodes 1 and 2 are connected together, producing a short circuit to odd harmonic mixing currents $I_1(f)$ and $I_2(f)$, reflecting them back to mixer 505 to remix. This results in a highly efficient mixer. The only mixing product that is allowed to flow to even IF port 107 is a predetermined low-frequency IF signal (i.e., $f_{IF} < 1$ GHz).

It will be understood and appreciated that the embodiments of the present invention described above are susceptible to various modifications, changes, and adaptations. All is intended to be comprehended within the meaning and range of equivalents of the appended claims.

What is claimed is:

1. A frequency-tunable resonator filter and mixer to provide a tunable bandpass filter and image-enhanced, double-balanced mixer in response to a radio-frequency (RF) input signal having a given frequency at an RF input, comprising:

at least one frequency-tunable resonator, comprising:
an input coupling loop coupled to the RF input for receiving the RF input signal;
a ferrimagnetic sphere proximate to the input coupling loop; and
an output coupling loop proximate to the ferrimagnetic sphere for receiving the RF input signal when a resonance frequency of the at least one frequency-tunable resonator approximates the given frequency of the RF input signal, the output coupling loop being terminated at a first end by a first intermediate-frequency (IF) balun having an input connected to the first end of the output coupling loop to provide an even harmonic IF balun, the output of the first IF balun being connected to an even IF port, and the output coupling loop being terminated at a second end by a diode bridge comprising four diodes;

an electromagnet for producing a DC magnetic field that is uniform over the at least one frequency-tunable resonator for tuning the resonance frequency of the at least one frequency-tunable resonator;

first and second capacitors connected between the respective junctions of the output coupling loop and the first IF balun, on the one hand, and ground, on the other hand;

third and fourth capacitors connected in series across the outputs of the diode bridge;

a swept local oscillator (LO) input for generating an LO signal, the junction between the third and fourth capacitors being connected to the LO input;

first and second inductors having first ends connected to the respective junctions of the diode bridge and the third and fourth capacitors, respectively; and a second IF balun having an input connected across second ends of the first and second inductors to provide a fundamental and odd harmonic IF balun, an output of the second IF balun being connected to an odd IF port;

wherein the frequency-tunable resonator filter and mixer provides one of odd and even harmonic mixing.

2. The frequency-tunable resonator filter and mixer in accordance with claim 1, further comprising a routing circuit for routing low-frequency input signals to a low-frequency output and high-frequency input signals to the output coupling loop, wherein the input coupling loop has a first end coupled to the RF input and a second end, the routing circuit comprising:

a first transmission line and a second transmission line connected in series between the second end of the input coupling loop and the low-frequency output;

a fifth capacitor and a first diode connected in series between ground and the junction of the RF input and first transmission line;

a sixth capacitor and a second diode connected in series between ground and the junction of the first and second transmission lines; and a bias network, comprising:
a first resistor having a first end connected to the junction of the fifth capacitor and first diode and a second resistor having a first end connected to the junction of the sixth capacitor and second diode, each of the first and second resistors having a second end connected to a first end of a third resistor;

a third inductor having a first end connected to a second end of the third resistor;

a seventh capacitor connected between a second end of the third inductor and ground; and a bias voltage selectively connected to the second end of the third inductor for simultaneously biasing the first and second diodes "on" to route the high-frequency input signals to the output coupling loop.

3. The frequency-tunable resonator filter and mixer in accordance with claim 2, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

4. The frequency-tunable resonator filter and mixer in accordance with claim 2, wherein the output coupling loop is terminated at the first end by an eighth capacitor connected in parallel with the input of the first IF balun, further comprising:

a ninth capacitor connected across the diode bridge; and tenth and eleventh capacitors connected between the respective junctions of the first inductor and the second IF balun and the second inductor and the second IF balun, on the one hand, and ground, on the other hand.

5. The frequency-tunable resonator filter and mixer in accordance with claim 4, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

6. The frequency-tunable resonator filter and mixer in accordance with claim 1, wherein the output coupling loop is terminated at the first end by a fifth capacitor connected in parallel with the input of the first IF balun, further comprising:

a sixth capacitor connected across the diode bridge; and seventh and eighth capacitors connected between the respective junctions of the first inductor and the second IF balun and the second inductor and the second IF balun, on the one hand, and ground, on the other hand.

7. The frequency-tunable resonator filter and mixer in accordance with claim 6, further comprising:

an IF switch for selectively switching to one of the odd and even IF ports to provide one of odd and even harmonic mixing, respectively.

8. The frequency-tunable resonator filter and mixer in accordance with claim 7, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

9. The frequency-tunable resonator filter and mixer in accordance with claim 6, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

10. The frequency-tunable resonator filter and mixer in accordance with claim 1, further comprising:

an IF switch for selectively switching to one of the odd and even IF ports to provide one of odd and even harmonic mixing, respectively.

11. The frequency-tunable resonator filter and mixer in accordance with claim 1, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

12. A frequency-tunable resonator filter and mixer to provide a tunable bandpass filter and image-enhanced, double-balanced mixer in response to a radio-frequency (RF) input signal having a given frequency at an RF input, comprising:

at least one frequency-tunable resonator, comprising:
an input coupling loop coupled to the RF input for receiving the RF input signal;
a ferrimagnetic sphere proximate to the input coupling loop; and
an output coupling loop proximate to the ferrimagnetic sphere for receiving the RF input signal when a resonance frequency of the at least one frequency-tunable resonator approximates the given frequency of the RF input signal, the output coupling loop being continuous at a first end and the output coupling loop being terminated at a second end by a diode bridge comprising four diodes;

an electromagnet for producing a DC magnetic field that is uniform over the at least one frequency-tunable resonator for tuning the resonance frequency of the at least one frequency-tunable resonator;

a swept local oscillator (LO) input connected to the first end of the output coupling loop for generating an LO signal;

an intermediate-frequency (IF) balun having an input connected across the diode bridge to provide a fundamental and odd harmonic IF balun, an output of the IF balun being connected to an odd IF port; and first and second capacitors connected between the respective junctions of the diode bridge and the IF balun, on the one hand, and ground, on the other hand;

wherein the frequency-tunable resonator filter and mixer mixes one of a fundamental and odd harmonic products of the LO signal with the RF input signal to produce a predetermined low-frequency IF signal output.

13. The frequency-tunable resonator filter and mixer in accordance with claim 12, further comprising a routing circuit for routing low-frequency input signals to a low-frequency output and high-frequency input signals to the output coupling loop, wherein the input coupling loop has a first end coupled to the RF input and a second end, the routing circuit comprising:

a first transmission line and a second transmission line connected in series between the second end of the input coupling loop and the low-frequency output;

a third capacitor and a first diode connected in series between ground and the junction of the RF input and first transmission line;

a fourth capacitor and a second diode connected in series between ground and the junction of the first and second transmission lines; and a bias network, comprising:
a first resistor having a first end connected to the junction of the third capacitor and first diode and a second resistor having a first end connected to the junction of the fourth capacitor and second diode, each of the first and second resistors having a second end connected to a first end of a third resistor;
an inductor having a first end connected to a second end of the third resistor;
a fifth capacitor connected between a second end of the inductor and ground; and
a bias voltage selectively connected to the second end of the inductor for simultaneously biasing the first and second diodes "on" to route the high-frequency input signals to the output coupling loop.

14. The frequency-tunable resonator filter and mixer in accordance with claim 12, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

15. The frequency-tunable resonator filter and mixer in accordance with claim 12, further comprising:

a third capacitor connected across the diode bridge.

16. A frequency-tunable resonator filter and mixer to provide a tunable bandpass filter and image-enhanced, double-balanced mixer in response to a radio-frequency (RF) input signal having a given frequency at an RF input, comprising:

at least one frequency-tunable resonator, comprising:
an input coupling loop coupled to the RF input for receiving the RF input signal;
a ferrimagnetic sphere proximate to the input coupling loop; and
an output coupling loop proximate to the ferrimagnetic sphere for receiving the RF input signal when a resonance frequency of the at least one frequency-tunable resonator approximates the given frequency of the RF input signal, the output coupling loop being continuous at a first end and connected to ground and the output coupling loop being terminated at a second end by a diode bridge comprising four diodes;

an electromagnet for producing a DC magnetic field that is uniform over the at least one frequency-tunable resonator for tuning the resonance frequency of the at least one frequency-tunable resonator;

first and second capacitors connected in series across the diode bridge;

a swept local oscillator (LO) input for generating an LO signal, the junction between the first and second capacitors being connected to the LO input;

first and second inductors having first ends connected to the respective junctions of the diode bridge and the first and second capacitors; and an intermediate-frequency (IF) balun having an input connected across second ends of the first and second inductors to provide a fundamental and odd harmonic IF balun, an output of the IF balun being connected to an odd IF port;

wherein the frequency-tunable resonator filter and mixer mixes one of a fundamental and odd harmonic products of the LO signal with the RF input signal to produce a predetermined low-frequency IF signal output.

17. The frequency-tunable resonator filter and mixer in accordance with claim 16, further comprising a routing circuit for routing low-frequency input signals to a low-frequency output and high-frequency input signals to the output coupling loop, wherein the input coupling loop has a first end coupled to the RF input and a second end, the routing circuit comprising:

a first transmission line and a second transmission line connected in series between the second end of the input coupling loop and the low-frequency output;

a third capacitor and a first diode connected in series between ground and the junction of the RF input and first transmission line;

a fourth capacitor and a second diode connected in series between ground and the junction of the first and second transmission lines; and a bias network, comprising:

a first resistor having a first end connected to the junction of the third capacitor and first diode and a second resistor having a first end connected to the junction of the fourth capacitor and second diode, each of the first and second resistors having a second end connected to a first end of a third resistor;

a third inductor having a first end connected to a second end of the third resistor;

a fifth capacitor connected between a second end of the third inductor and ground; and a bias voltage selectively connected to the second end of the third inductor for simultaneously biasing the first and second diodes "on" to route the high-frequency input signals to the output coupling loop.

18. The frequency-tunable resonator filter and mixer in accordance with claim 16, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

19. The frequency-tunable resonator filter and mixer in accordance with claim 16, further comprising:

a third capacitor connected across the diode bridge; and fourth and fifth capacitors connected between the second ends of the first and second inductors, respectively, and ground.

20. A frequency-tunable resonator filter and mixer to provide a tunable bandpass filter and image-enhanced, double-balanced mixer in response to a radio-frequency (RF) input signal having a given frequency at an RF input, comprising:

at least one frequency-tunable resonator, comprising:

an input coupling loop coupled to the RF input for receiving the RF input signal;

a ferrimagnetic sphere proximate to the input coupling loop; and an output coupling loop proximate to the ferrimagnetic sphere for receiving the RF input signal when a resonance frequency of the at least one frequency-tunable resonator approximates the given frequency of the RF input signal, the output coupling loop being terminated at a first end by an intermediate-frequency (IF) balun having an input connected to the first end of the output coupling loop to provide an even harmonic IF balun, an output of the IF balun being connected to an even IF port, and the output coupling loop being terminated at a second end by a diode bridge comprising four diodes;

an electromagnet for producing a DC magnetic field that is uniform over the at least one frequency-tunable resonator for tuning the resonance frequency of the at least one frequency-tunable resonator;

a swept local oscillator (LO) input connected across the diode bridge for generating an LO signal; and first and second capacitors connected between the respective junctions of the output coupling loop and the IF balun, on the one hand, and ground, on the other hand;

wherein the frequency-tunable resonator filter and mixer mixes even harmonic products of the LO signal with the RF input signal to produce a predetermined low-frequency IF signal output.

21. The frequency-tunable resonator filter and mixer in accordance with claim 20, further comprising a routing circuit for routing low-frequency input signals to a low-frequency output and high-frequency input signals to the output coupling loop, wherein the input coupling loop has a first end coupled to the RF input and a second end, the routing circuit comprising:

a first transmission line and a second transmission line connected in series between the second end of the input coupling loop and the low-frequency output;

a third capacitor and a first diode connected in series between ground and the junction of the RF input and first transmission line;

a fourth capacitor and a second diode connected in series between ground and the junction of the first and second transmission lines; and a bias network, comprising:

a first resistor having a first end connected to the junction of the third capacitor and first diode and a second resistor having a first end connected to the junction of the fourth capacitor and second diode, each of the first and second resistors having a second end connected to a first end of a third resistor;

an inductor having a first end connected to a second end of the third resistor;

a fifth capacitor connected between a second end of the inductor and ground; and a bias voltage selectively connected to the second end of the inductor for simultaneously biasing the first and second diodes "on" to route the high-frequency input signals to the output coupling loop.

22. The frequency-tunable resonator filter and mixer in accordance with claim 20, further comprising:

a second frequency-tunable resonator having an input coupled to the RF input and an output to provide a first stage of the filter;

a third frequency-tunable resonator having an input coupled to the output of the second frequency-tunable resonator and an output to provide a second stage of the filter; and a fourth frequency-tunable resonator having an input coupled to the output of the third frequency-tunable resonator and an output to provide a third stage of the filter;

wherein the electromagnet produces a DC magnetic field that is uniform over the frequency-tunable resonators for tuning the resonance frequency of the resonators; and wherein the input coupling loop of the at least one frequency-tunable resonator is coupled to the output of the fourth frequency-tunable resonator to provide a fourth stage of the filter, as well as an image-enhanced, double-balanced mixer.

23. The frequency-tunable resonator filter and mixer in accordance with claim 20, wherein the output coupling loop is terminated at the first end by a third capacitor.

* * * * *